(12) United States Patent
Wang et al.

(10) Patent No.: US 12,230,683 B2
(45) Date of Patent: Feb. 18, 2025

(54) THIN FILM TRANSISTOR HAVING A SEMICONDUCTOR LAYER COMPRISING A PLURALITY OF SEMICONDUCTOR BRANCHES

(71) Applicant: BOE Technology Group Co., Ltd., Beijing (CN)

(72) Inventors: Lizhong Wang, Beijing (CN); Ce Ning, Beijing (CN); Hehe Hu, Beijing (CN); Tianmin Zhou, Beijing (CN); Jipeng Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 474 days.

(21) Appl. No.: 17/755,380

(22) PCT Filed: May 19, 2021

(86) PCT No.: PCT/CN2021/094512
§ 371 (c)(1),
(2) Date: Apr. 30, 2022

(87) PCT Pub. No.: WO2022/001442
PCT Pub. Date: Jan. 6, 2022

(65) Prior Publication Data
US 2022/0344480 A1 Oct. 27, 2022

(30) Foreign Application Priority Data
Jun. 28, 2020 (CN) .......................... 202010598519.X

(51) Int. Cl.
*H01L 29/786* (2006.01)
*H01L 29/417* (2006.01)

(52) U.S. Cl.
CPC .. *H01L 29/41733* (2013.01); *H01L 29/78696* (2013.01)

(58) Field of Classification Search
CPC ........... H01L 29/7831; H01L 29/78687; H01L 29/78696
(Continued)

(56) References Cited

U.S. PATENT DOCUMENTS 5,852,318 A 12/1998 Chikamatsu et al.
7,326,935 B2 * 2/2008 Klausmann ........... G01T 1/2006
250/370.11

(Continued)

FOREIGN PATENT DOCUMENTS

CN 1195894 A 10/1998
CN 1619399 A 5/2005
(Continued)

OTHER PUBLICATIONS

International Search Report & Written Opinion mailed Jul. 28, 2021, regarding PCT/CN2021/094512; English translation attached.
(Continued)

*Primary Examiner* — Hoai V Pham
(74) *Attorney, Agent, or Firm* — Intellectual Valley Law, P.C.

(57) ABSTRACT

The present disclosure provides a thin film transistor, a GOA circuit and an array substrate, the thin film transistor including a source electrode, including a source electrode wiring and a plurality of source electrode branches; a drain electrode, including a drain electrode wiring and a plurality of drain electrode branches; a gate; a semiconductor layer including a plurality of semiconductor branches; a plurality of source electrode branches. The plurality of drain electrode branches are in contact with the plurality of semiconductor branches and are divided into a plurality of cells; the source electrode wiring and the drain electrode wiring are arranged in a parallel and spaced apart, and the number m of one of the source electrode wiring and the drain electrode wiring is
(Continued)

an integer greater than or equal to 2, and the number n of the other is an integer greater than or equal to 1.

20 Claims, 7 Drawing Sheets

(58) Field of Classification Search
USPC .................................................. 257/59, 72
See application file for complete search history.

(56) References Cited

U.S. PATENT DOCUMENTS

| | | |
|---|---|---|
| 2004/0173795 A1 | 9/2004 | Moon et al. |
| 2005/0041168 A1 | 2/2005 | Jang et al. |
| 2005/0139835 A1 | 6/2005 | Lee |
| 2006/0125741 A1 | 6/2006 | Tanaka et al. |
| 2011/0001736 A1 | 1/2011 | Tanaka et al. |
| 2011/0303916 A1 | 12/2011 | Takanishi et al. |
| 2013/0306968 A1 | 11/2013 | Chang et al. |
| 2016/0372487 A1 | 12/2016 | Wang et al. |
| 2018/0047656 A1 | 2/2018 | Mkhitarian et al. |
| 2018/0211898 A1 | 7/2018 | Oshima et al. |
| 2020/0193932 A1 | 6/2020 | Liu et al. |
| 2021/0005726 A1 | 1/2021 | Long et al. |

FOREIGN PATENT DOCUMENTS

| | | |
|---|---|---|
| CN | 1815536 A | 8/2006 |
| CN | 101552294 A | 10/2009 |
| CN | 101944318 A | 1/2011 |
| CN | 101946327 A | 1/2011 |
| CN | 102308389 A | 1/2012 |
| CN | 102760772 A | 10/2012 |
| CN | 104465787 A | 3/2015 |
| CN | 105097926 A | 11/2015 |
| CN | 206893620 U | 1/2018 |
| CN | 108028226 A | 5/2018 |
| CN | 109309100 A | 2/2019 |
| CN | 109844956 A | 6/2019 |
| CN | 110582846 A | 12/2019 |
| CN | 209747524 U | 12/2019 |
| JP | H03245126 A | 10/1991 |

OTHER PUBLICATIONS

First Office Action in the Chinese Patent Application No. 202010598519.X, dated May 11, 2022; English translation attached.

Extended European Search Report in the European Patent Application No. 21833911.7, dated Jul. 24, 2023.

* cited by examiner

THIN FILM TRANSISTOR HAVING A SEMICONDUCTOR LAYER COMPRISING A PLURALITY OF SEMICONDUCTOR BRANCHES

CROSS-REFERENCE TO RELATED APPLICATION

This application is the U.S. national stage application under 35 U.S.C. § 371 of International Application No. PCT/CN2021/094512, filed on Mar. 19, 2021, which claims priority to Chinese Patent Application No. 202010598519.X, filed in China on Jun. 28, 2020. Each of the forgoing applications is herein incorporated by reference in its entirety for all purposes.

TECHNICAL FIELD

The present disclosure relates to displaying technical fields, and more particularly, to a thin film transistor, a Gate-on-Array circuit, and an array substrate.

BACKGROUND

Switching elements in the display technical field play an important role in high display device. For example, the conductivity of the thin film transistor (TFT) directly affects the turn-on degree of the TFT, affects the deflection degree of the liquid crystal molecular, and thus affects the display screen of the image.

At present, there are mainly higher requirements for charging current of TFTs. Generally, the charging current of the TFT is increased by increasing the width to length ratio of the TFT channel. For example, particularly for a gate electrode row driving circuit (GOA circuit) fabricated in a non-display area on an array substrate, the charging current requirement for TFTs in the circuit is higher, and for TFTs fabricated in a non-display area of an array substrate, the size requirement for TFTs is lower compared to the design in a pixel, and therefore, TFTs having a larger area and a higher charging current are designed.

The material of TFT semiconductor layer mainly includes amorphous silicon (a-Si) or oxide (such as IGZO, i.e. Indium Gallium Zinc Oxide, inGaZn oxide), etc. With the demand for high PPI (Pixels Per Inch, pixels per inch (PPI)), high refresh frequency and narrow frame products, the traditional a-Si thin film transistor products cannot meet the requirements of device performance, and oxide technology as the most likely new technology to replace a-Si thin film transistor products has become the focus of various display manufacturers.

At present, the mobility of conventional IGZO TFTs are below 10 A, but with higher resolution, higher refresh frequency products, high mobility oxide has the problem of very large instability of device characteristics, especially the large width-to-length ratio leads to a large increase in ion mobility (Ion), and the problem of device heating is prominent, finally leading to the problem of poor reliability of display devices.

SUMMARY

The embodiments of the present disclosure provide a thin film transistor, a GOA circuit, and an array substrate, capable of solving the problem that the source and drain branches of the thin film transistor device of the related art are arranged in a form of high concentration, causing heat concentration, resulting in poor reliability of a display device.

The technical solution provided by the embodiments of the present disclosure is as follows:

The present disclosure embodiment provides a thin film transistor comprising:
a source electrode, including a source electrode wiring and a plurality of source electrode branches;
a drain electrode, including a drain electrode wiring and a plurality of drain electrode branches;
a gate insulated from the source electrode and the drain electrode;
and a semiconductor layer in contact with and connected to the source electrode branch and the drain electrode branch, comprising a plurality of semiconductor branches;
wherein the plurality of the source electrode branch, and the plurality of the drain electrode branch are in contact with the plurality of the semiconductor branch, and are divided into a plurality of cells, wherein each cell comprises M source electrode branches, N drain electrode branches and Q semiconductor branches, and M, N and Q are integers greater than or equal to 1;
the source electrode wiring and the drain electrode wiring are arranged in parallel and spaced apart, and the number m of one of the source electrode wiring and the drain electrode wiring is an integer greater than or equal to 2, and the number n of the other is an integer greater than or equal to 1;
a plurality of the cells are arranged in a region between the source electrode wiring and an adjacent the drain electrode wiring, so as to arrange the plurality of the cells into at least two cell lines, wherein the source electrode branch of each cell in each cell line is electrically connected to the same one of the source electrode wiring, and the drain electrode branch of each cell in each cell line is electrically connected to the same one of the drain electrode wiring.

In some embodiments of the present disclosure, the source electrode wiring and the drain electrode wiring are arranged alternately, and the drain electrode branch of each cell in two adjacent cell lines share the same drain electrode wiring.

In some embodiments of the present disclosure, the line width of the drain electrode branch and/or the drain electrode wiring is 3-15 μm.

In some embodiments of the present disclosure, the source electrode wiring and the drain electrode wiring are arranged alternately, and the source electrode branch of each cell in two adjacent cell lines share the same source electrode wiring.

In some embodiments of the present disclosure, the number of the source electrode wiring is greater than or equal to 2, the number of the drain electrode wiring is greater than or equal to 2, and one of the source electrode wiring and one of the drain electrode wiring are arranged adjacent to each other and form a group of wiring; one cell line is set between the source electrode wiring and the drain electrode wiring within the same group of wiring, and the source electrode wiring and the drain electrode wiring do not share between different groups of wiring.

In some embodiments of the present disclosure, each of the cell lines includes at least two of the cells, and a predetermined distance is maintained between the cells in each of the cell lines.

In some embodiments of the present disclosure, the number q of the cells in the thin film transistor is greater than or equal to 3, and/or the predetermined distance d is 20 μm≤d≤500 μm.

In some embodiments of the present disclosure, only one such cell is included in each such cell line.

In some embodiments of the present disclosure, in each of the cells, the number Q of the semiconductor branches is greater than or equal to 2, and each of the semiconductor branch is arranged in parallel and spaced apart; and the orthographic projection of the channel of each of the semiconductor branch on the base substrate is in a continuous strip shape, the number of one of the source electrode branch and the source electrode branch is greater than or equal to 2, and the number of the other is greater than or equal to 1, and the drain electrode branch and the drain electrode branch are alternately arranged along the strip-shaped extension direction of the semiconductor branch in an interdigital electrode array.

In some embodiments of the present disclosure, in each cell, the number Q of the semiconductor branch is greater than or equal to 2, and each semiconductor branch is arranged in parallel and at intervals;

And the orthographic projection of the channel of each semiconductor branch on the base substrate is in a discontinuous strip shape, and forms a plurality of channel independent from each other, and each channel connects at least one source electrode branch and at least one drain electrode branch respectively.

In some embodiments of the present disclosure, in each of the cells, the number Q of the semiconductor branches is greater than or equal to 2, and each of the semiconductor branch is arranged in parallel and spaced apart, and the orthographic projection of the channel of at least one of the semiconductor branch on the base substrate is in a continuous strip shape, the orthographic projection of at least one channel of the semiconductor branch on the base substrate is in a discontinuous strip shape, and is formed so as to form a plurality of segment of channel which are independent from each other;

the number of one of the source electrode branch and the drain electrode branch is greater than or equal to 2, and the number of the other is greater than or equal to 1; the source electrode branch and the drain electrode branch are alternately arranged in a belt-shaped extension direction of the semiconductor branch in an interdigital electrode array, wherein each segment of the channel is connected to at least one of the source electrode branch and at least one of the drain electrode branch.

In some embodiments of the present disclosure, at least three semiconductor branch are included in the cell, and the orthographic projection of the channel of at least one of the semiconductor branch on the base substrate is in a continuous strip shape, and the orthographic projection of the channel of at least one of the semiconductor branch on the base substrate is in a discontinuous strip shape, and when forming a multi-segment channel independent of each other, the semiconductor branch in a continuous strip shape is located on both sides of the semiconductor branch in a discontinuous strip shape.

In some embodiments of the present disclosure, at least one of the semiconductor branch in the cell is a compensation semiconductor branch, and the total length of the channel of the compensation semiconductor branch is less than the total length of the channel of other semiconductor branch.

In some embodiments of the present disclosure, in each of the cells, the number Q of the semiconductor branch is equal to 1, and the orthographic projection of the semiconductor branch on the base substrate is in the form of a continuous strip, one of the source electrode branch and the source electrode branch has a number greater than or equal to 2, and the other has a number greater than or equal to 1, and the drain electrode branch and the drain electrode branch are alternately arranged in the strip-like extending direction of the semiconductor branch in the form of an interdigital electrode array.

In some embodiments of the present disclosure, in each cell, the number Q of the semiconductor branches is equal to 1, and the orthographic projection of the semiconductor branch on the base substrate is in a discontinuous strip shape, and forms a plurality of segments of channel which are independent from each other, with each segment of channel respectively connecting at least one source electrode branch and at least one drain electrode branch.

In some embodiments of the present disclosure, in each of the semiconductor branch, the width W of the channel corresponding to the drain electrode branch and the source electrode branch arranged adjacently is 2-20 μm, and the length L of the channel is 2-20 μm.

In some embodiments of the present disclosure, the orthographic projection of the gate on the base substrate does not overlap the orthographic projection of the source electrode wiring on the base substrate, and the orthographic projection of the gate on the base substrate overlaps the orthographic projection of the drain electrode wiring on the base substrate.

In some embodiments of the present disclosure, the First terminal of the source electrode wiring is connected to a clock pulse signal wiring.

In some embodiments of the present disclosure, the orthographic projection of the gate on the base substrate does not overlap with the orthographic projection of the clock pulse signal wiring on the base substrate, a gate wiring is connected to the gate, and the orthographic projection of the gate wiring on the base substrate is arranged crosswise to the orthographic projection of the clock pulse signal wiring on the base substrate.

In some embodiments of the present disclosure, a drain electrode block is formed by using a metal layer of the drain electrode is provided between two adjacent cell, and the drain electrode block overlaps with the orthographic projection of the gate on the base substrate.

The present disclosure embodiment also provides a gate electrode row driving circuit comprising:

A plurality of thin film transistor as described above;

a signal output, wherein each drain electrode wiring in the thin film transistor is connected to the same the signal output;

and a clock pulse signal line, each source electrode wiring in the thin film transistor being connected to the same clock pulse signal line.

An array substrate comprising a Gate on Array circuit as described above.

The benefits provided by the embodiment of the present disclosure are as follows:

The number of at least one of thin film transistor, gate electrode row driving circuit and array substrate, source electrode wiring and drain electrode wiring provided by the embodiment of the present disclosure is designed to be 2 or more, that is, at least one of the source electrode wiring and the drain electrode wiring is a dual wiring or a multi-wiring design, and in a thin film transistor, the source electrode branch, the drain electrode branch and the semiconductor branch are divided into a plurality of groups; each group is a cell, and each cell is arranged in a region between an adjacently arranged source electrode wiring and a drain electrode wiring, so that each cell is divided into at least two rows, that is, at least two cell lines are formed, and in this way, the heat dissipation capacity from the center of the thin film transistor to the periphery can be improved by a multi-wiring design; reducing the heat collection capacity on each wiring, so as to reduce the heating effect of current collection on the contact position between source and drain and semiconductor layer; also, by increasing the number of source electrode wiring or drain electrode wiring, it is possible to increase the number of cell divisions in the thin film transistor, thereby reducing the heat generation energy of each cell, thereby greatly improving the stability of the thin film transistor.

DETAILED DESCRIPTION

Figure 1:
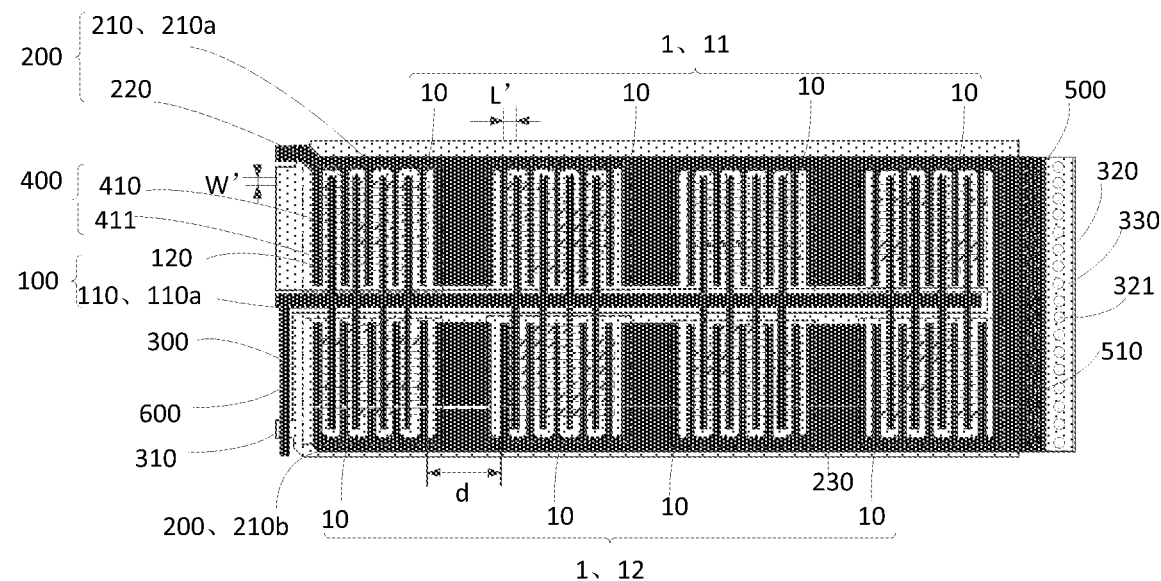
FIG. 1 shows a structural diagram of some exemplary embodiments of thin film transistor provided by the present disclosure.

For the purpose of clarifying the objects, technical solutions and advantages of the embodiment of the present disclosure, a clear and complete description of the technical solutions of the embodiment of the present disclosure will be made with reference to the accompanying drawings of the embodiment of the present disclosure. It is evident that the described embodiment are part of the embodiment of the present disclosure, not all embodiment. Based on the described embodiment of the present disclosure, all other embodiment obtained by a person of ordinary skill in the art without inventive effort are within the scope of protection of the present disclosure.

Unless defined otherwise, technical or scientific terms used in this disclosure shall have the ordinary meaning as understood by one of ordinary skill in the art to which this disclosure belongs. The use of "first", "second", and the like in this disclosure does not denote any order, quantity, or importance, but rather is used to distinguish one element from another. Likewise, terms such as "a", "an", or "the" do not denote a limitation of quantity, but rather denote the presence of at least one of the referenced item. The word "comprising" or "comprises", and the like, means that the presence of an element or item preceding the word covers the presence of the element or item listed after the word and equivalents thereof, but does not exclude other elements or items. Connected and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

Before describing in detail the thin film transistor, gate electrode row driving circuit, array substrate and display device provided by embodiment of the present disclosure, it is necessary to describe the related art as follows:

In the related art, the GOA (Gate Driver on array, array substrate) technology refers to integrating a gate electrode Driver on an array substrate to form a scanning drive for a panel. Compared with traditional chip on film (COF) and chip on glass (COG) technology, the main feature of GOA technology is to rely on the continuous trigger of GOA-driven cell integrated on array substrate to realize its shift register function, which replaces the Bonding area and Fan-out wiring space of the original Gate Driver IC, so that the panel can achieve a two-sided symmetrical aesthetic design, achieve a narrow frame design, reduce costs, and at the same time, it is advantageous to improve productivity and yield.

In GOA circuits, the material of TFT semiconductor layer mainly includes amorphous silicon (a-Si) or oxide (such as IGZO, i.e. Indium Gallium Zinc Oxide, inGaZn oxide), etc. With the demand of high PPI (Pixels Per Inch, pixels per inch (PPI)), high refresh frequency and narrow frame products, the traditional a-Si thin film transistor products cannot meet the requirements of device performance, and oxide technology as the most likely new technology to replace a Si thin film transistor products has become the focus of various display manufacturers.

Generally, a GOA circuit comprises a plurality of thin film transistor, wherein each thin film transistor comprises a plurality of source electrode branch, a plurality of semiconductor electrode branch, a source electrode wiring and a drain electrode wiring, the plurality of source electrode branch is connected to the source electrode wiring, the plurality of drain electrode branch is connected to the drain electrode wiring, the plurality of source electrode branch and the plurality of drain electrode branch are divided into a plurality of cells (TFT units), and there is almost no distribution of distance between each cell.

Since the current on the source electrode branch and the drain electrode branch is closely related to the magnitude of heat, it is the most direct and effective method to solve the heat generation of GOA circuit to increase the number of branch to reduce the current on each branch and thus reduce the heat of each branch. However, this method is only suitable for amorphous silicon thin film transistor (a-Si TFT) with a small mobility. For a large-size oxide thin film transistor (oxide TFT), since the oxide TFT has a high ion mobility, it is easy to generate heat, and the problem of heat generation is more serious. The main reasons are as follows: first, the number of source and drain branch is increased and arranged in a high aggregation form, and this high aggregation form is easy to cause heat aggregation, and the heat cannot be dissipated; secondly, the contact position between oxide semiconductor layer and source and drain branch generates the most severe heat. At the same time, since the contact part between source and drain branch and semiconductor layer is on the conductor with concentrated current, the conductor with concentrated current is also easy to generate high heat, which further aggravates the heat accumulation, and the accumulated heat will reduce the reliability of display panel.

At present, the source electrode wiring and the drain electrode wiring of the TFT in the GOA circuit are both single wiring designs, and the source electrode branch of all the cells in the TFT are connected to the same source electrode wiring. The drain electrode branch of all the cells are connected to the same drain electrode wiring. The disadvantage of this design is that the source and pole branch, especially the drain electrode branch, have the effect of current convergence, resulting in serious wiring current heating. The source and drain wiring distribute around the source electrode branch and the drain electrode branch, and the high heat in the periphery blocks the internal heat loss to the periphery, which aggravates the deterioration of the thin film transistor.

In view of the above-mentioned technical problems, the embodiment of the present disclosure provides a thin film transistor, a Gate on Array circuit (GOA circuit), an array substrate and a display device, which can solve the problems that the source and drain branch of a thin film transistor device in the related art are arranged in a form of high concentration, causing heat concentration and resulting in poor reliability of a display device.

As shown in FIGS. 1 to 15, the thin film transistor provided by the embodiment of the present disclosure comprises a base substrate, and a source electrode 100, a drain electrode 200, a gate electrode 300 and a semiconductor layer 400 arranged on the base substrate. The source electrode 100 comprises a source electrode wiring 110 and a plurality of source electrode branch 120, the source electrode 200 comprises a drain electrode wiring 210 and a plurality of drain electrode branch 220, the gate electrode 300 is located at one side of the source electrode 100 and the drain electrode 200 close to the base substrate or one side away from the base substrate, and is insulated from the source electrode 100 and the drain electrode 200; the semiconductor layer 400 is in contact with the source electrode branch 120 and the drain electrode branch 220, and the semiconductor layer 400 comprises a plurality of semiconductor branch 410;

Wherein a plurality of the source electrode branch 120 and a plurality of the drain electrode branch 220 are in contact with a plurality of the semiconductor branch 410, and are divided into a plurality of groups, each group being a cell (TFT unit) 10, each cell 10 comprising M source electrode branch 120, N drain electrode branch 220 and Q semiconductor branch 410, and M, N and Q are integers greater than or equal to 1;

the source electrode wiring 110 and the drain electrode wiring 210 are arranged in parallel and spaced apart, and the number m of one of the source electrode wiring 110 and the drain electrode wiring 210 is an integer greater than or equal to 2, and the number n of the other is an integer greater than or equal to 1;

A plurality of the cells 10 are arranged in a region between the source electrode wiring 110 and an adjacent the drain electrode wiring 210, so as to arrange the plurality of the cells 10 into at least two cell line 1, wherein the source electrode branch 120 of each cell 10 in each cell line 1 is electrically connected to the same one of the source electrode wiring 110, and the drain electrode branch 220 of each cell 10 in each cell line 1 is electrically connected to the same one of the drain electrode wiring 210.

In the embodiment disclosed above, by designing the number of wiring of at least one of the source electrode wiring 110 and the drain electrode wiring 210 to be two or more, that is to say, in the source electrode wiring 110 and the drain electrode wiring 210, at least one is a double wiring or multiple wiring design, and the other can be a single wiring or a double wiring or multiple wiring design; in the thin film transistor, the source electrode branch 120, the drain electrode branch 220 and the semiconductor branch 410 are divided into multiple groups; each group is a cell 10, and each cell 10 is arranged in a region between an adjacently arranged source electrode wiring 110 and a drain electrode wiring 210, so that each cell 10 is divided into at least two rows, that is to say, at least two cell lines 1 are formed, and in this way, through a multi-wiring design, the heat dissipation capacity of a thin film transistor from the center to the periphery can be improved; at the same time, taking the case where the thin film transistor is applied to a gate electrode row driving circuit (GOA circuit), and there are at least two drain electrode wiring 210 as an example, the gate electrode row driving circuit comprises a signal output and a clock pulse signal line (CLK line), a source electrode wiring 110 of a thin film transistor is connected to the clock pulse signal line 600, and each drain electrode wiring 210 can be connected to the same signal output 500, so that the current accumulation on each drain electrode wiring 210 can be reduced; the current accumulated inside the thin film transistor cell 10 will not all gather on the same wiring, reducing the heat collection capacity on each wiring, thereby reducing the heating effect of the current collection on the contact position of the source and drain 200 and the semiconductor layer 400; also, by increasing the number of the source electrode wiring 110 or the drain electrode wiring 210, an increase in the number of divided cells 10 in the thin film transistor can be achieved to reduce the heat generation energy of each cell 10, thereby greatly improving the stability of the thin film transistor, especially for a thin film transistor having a semiconductor layer channel width W>0 μm.

Note that in the gate electrode row driving circuit thin film transistor provided by the embodiment of the present disclosure, the semiconductor layer 400 is an oxide semiconductor layer 400, such as IGZO, that is, the gate electrode row driving circuit thin film transistor is an oxide thin film transistor, mainly aiming at solving the heat dissipation problem of the oxide thin film transistor.

However, the embodiment of the present disclosure is not limited thereto, and in practical applications, the semiconductor layer 400 may also be an amorphous silicon layer (a-si), or may also be a stack structure of amorphous oxide and crystallization oxide, or may be other, and is not specifically limited herein and will not be described again.

In the stack structure of amorphous oxide and crystallization oxide, especially the thin film transistor of the stack structure of top crystallization oxide, the resistor of the contact between the top crystallization oxide and the metal of source and drain 200 is higher than the resistor of the contact between resistor of the contact between the amorphous oxide and the metal of source and drain 200, the heating phenomenon is more serious, and the heating phenomenon can be solved by applying the solution of the thin film transistor provided by the embodiment of the present disclosure.

In addition, in the related art, a plurality of source electrode branch 120 and a plurality of drain electrode branch 220 of a thin film transistor in a GOA circuit are divided into a number of cells 10, but the number of cell 10 divisions is less than or equal to 3, and there is no distance (space) design between adjacent cells 10, and this aggregation design pattern causes a heat dissipation problem to be highlighted, particularly in the case of an oxide thin film transistor.

With regard to the above-mentioned problem, in the embodiment of the present disclosure, the number q of divisions of the cell 10 in the thin film transistor is greater than or equal to 3, that is to say, a plurality of source electrode branch 120, a plurality of drain electrode branch 220 and a plurality of semiconductor branch 410 are designed for multi-division; such that the number of cell 10 divided by the source electrode branch 120 and the drain electrode branch 220 is greater than or equal to 3, that is, compared with the case where the number of cell 10 divided by the thin film transistor in the related art is less than or equal to 3, in the case where the total number of the source electrode branch 120 and the drain electrode branch 220 is the same, the number of cell 10 divisions of the gate electrode row driving circuit thin film transistor provided by the embodiment of the present disclosure is increased, and a predetermined distance is formed between the cell 10. Through the small number of the source electrode branch 120 and the drain electrode branch 220 in each cell 10 and the distance formed between the cells 10, a space is provided for heat dissipation to improve the heat dissipation efficiency so as to increase the heat dissipation capacity of the thin film transistor.

Figure 16:
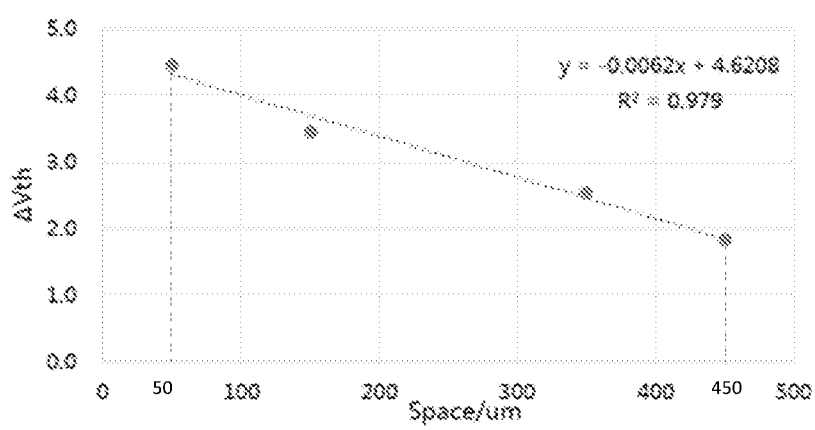
FIG. 16 is a diagram showing a relationship between a predetermined distance between adjacent cells in a thin film transistor provided by the embodiment of the present disclosure and the stability of the thin film transistor.

Here, in the thin film transistor provided by the embodiment of the present disclosure, the greater the predetermined distance d between adjacent cells 10 within each cell line 1, the greater the heat dissipation capacity, and the better the stability of the thin film transistor, wherein the stability relationship between the predetermined distance d and the thin film transistor is as shown in FIG. 16. It can be seen from FIG. 16 that, under the same process conditions, the predetermined distance d has a linear law on the current stability as a whole; in order to achieve an optimal heat dissipation effect, the predetermined distance d should be at least greater than or equal to 20 μm, while taking into account the frame effect, the predetermined distance d should be less than or equal to 500 μm; furthermore, the value of the predetermined distance d can be between 50 μm and 450 μm.

The following provides a more detailed description of the thin film transistor of the present disclosure.

FIG. 1 shows a structural diagram of thin film transistor in a specific exemplary embodiments provided by the present disclosure.

As shown in FIG. 1, in an exemplary embodiment, since the current on the drain electrode wiring 210 has a strong heat concentration capability, in order to reduce the heat concentration on the drain electrode wiring 210, in some embodiment, the drain electrode wiring 210 is designed as a double wiring or a multiple wiring, wherein the number m of the drain electrode wiring 210 is at least two, and each of the drain electrode wiring 210 is connected to the same signal output 500;

The number n of the source electrode wiring 110 is at least 1;

The source electrode wiring 110 and the drain electrode wiring 210 are alternately arranged at intervals, and the plurality of cells 10 are distributed at intervals in an area between adjacent drain electrode wiring 210 and source electrode wiring 110, so that the plurality of cells 10 of each thin film transistor are arranged as at least two cell line 1, and the source electrode 100 of each cell 10 in two adjacent cell line 1 share the same source electrode wiring 110.

In the above-mentioned exemplary embodiment, the drain electrode wiring 210 is designed as a double wiring or a multiple wiring, and multiple drain electrode wiring 210 are all connected to the same signal output 500, so that, on the one hand, the number of the thin film transistor cell 10 can be increased, and the number of the source electrode branch 120 and the drain electrode branch 220 is increased, so that the heat of each branch can be reduced; on the other hand, it is possible to reduce the current accumulation on each semiconductor electrode wiring 210, and the current accumulation inside the thin film transistor cell 10 is not all accumulated on the same wiring, thus reducing the heat accumulation capacity on each wiring, thereby reducing the heating effect of the current accumulation on the contact position of the source and drain 200 and the drain layer 400.

Specifically, as shown in FIG. 1, in some exemplary embodiment, the thin film transistor includes a source electrode 100, a drain electrode 200, a gate electrode 300, and a semiconductor layer 400. The source electrode 100 comprises a plurality of source electrode branch 120 and a first source electrode wiring 110a, the source electrode 200 comprises a plurality of drain electrode branch 220, a first drain electrode wiring 210a and a second drain electrode wiring 210b, wherein the semiconductor layer 400 comprises a plurality of semiconductor branch 410, and the source electrode branch 120, the drain electrode branch 220 and the semiconductor branch 410 are divided into a plurality of cell 10 (TFT units), wherein each cell 10 comprises M source electrode branch 120, N drain electrode branch 220 and Q semiconductor branch 410, M; N and Q are both integers greater than or equal to 1;

The first source electrode wiring 110a, the first drain electrode wiring 210a and the second drain electrode wiring 210b are arranged in parallel and spaced apart; and the first source electrode wiring 110a is located between a first drain electrode wiring 210a and a second drain electrode wiring 210b, and a plurality of cells 10 are arranged at intervals between the first source electrode wiring 110a and the first drain electrode wiring 210a to form a first cell line 11; a plurality of cells 10 are arranged at intervals between the first source electrode wiring 110a and the second drain electrode wiring 210b to form a second cell line 12;

Wherein the drain electrode branch 220 of each cell 10 in the first cell line 11 is connected to the first drain electrode wiring 210a, and the drain electrode branch 220 of each cell 10 in the second cell line 12 is connected to the second drain electrode wiring 210b; the source electrode branch 120 of each cell 10 in the first cell line 11 is connected to one side of the first source electrode wiring 110a, and the source electrode branch 120 of each cell 10 in the second cell line 12 is connected to the other side of the first source electrode wiring 110a, that is, the source electrode branch 120 in the first cell line 11 shares the same source electrode wiring 110a with the source electrode branch 120 in the second cell line 12.

In addition, in some of the embodiment shown in FIG. 1, in order to increase the heat dissipation capacity of the thin film transistor, the line width of the drain electrode branch 220 can also be increased, and the line width of the drain electrode branch 220 is about 3-15 µm, and the heat dissipation capacity of the thin film transistor itself can also be improved by increasing the line width of the drain electrode branch 220; further, in other embodiment of the present disclosure, it is also possible to increase the heat dissipation capacity by increasing the line width of the drain electrode wiring 210, for example, the line width of the drain electrode wiring 210 is 3-15 µm.

Furthermore, in the above-mentioned public embodiment, the number q of the cells 10 in the thin film transistor is greater than or equal to 3, for example, in the thin film transistor illustrated in FIG. 1, the number q of the cells 10 in the first cell line 11 is 4, and the number q of the cells 10 in the second cell line 12 is 4; the number of cells 10 in the thin film transistor is 8 in total, and it can be certainly understood that the number q of cells 10 in each cell line 1 is not limited thereto, for example, the number of cells 10 in each cell line 1 can also be only 2, and thus the total number of cells 10 of two cell lines 1 in the thin film transistor is still greater than 3. In order to improve the heat dissipation performance of the thin film transistor, the number of cells 10 in the thin film transistor can also be less than or equal to 3 according to actual requirements.

Furthermore, according to different products and frame requirements, it is possible to keep a predetermined distance d between each cell 10 in each cell line 1 between 20-500 µm; furthermore, the value of the predetermined distance d is between 50-450 µm; for example, in the thin film transistor illustrated in FIG. 1, the predetermined distance d is 70 µm; however, the above is merely a specific example, and in practical applications, the predetermined distance d between the cells 10 in each cell line 1 is not limited thereto.

Furthermore, in the thin film transistor illustrated in FIG. 1, the number Q of the semiconductor branch 410 in each cell 10 is greater than or equal to 2, and each semiconductor branch 410 is arranged in parallel and at intervals; the orthographic projection of the channel of each of the semiconductor branch 410 on the base substrate is in the form of a continuous strip, and the number of one of the source electrode branch 120 and the source electrode branch 220 is greater than or equal to 2, and the number of the other is greater than or equal to 1. The drain electrode branch 120 and the drain electrode branch 220 are alternately arranged in the strip-like extending direction of the semiconductor branch 410 in the form of an interdigital electrode array.

In the above-mentioned solution, the semiconductor layer 400 in each cell 10 comprises a plurality of semiconductor branch 410, and each semiconductor branch 410 is in a continuous strip shape, that is to say, the channel of each semiconductor branch 410 is uninterrupted; and the source electrode branch 120 and the drain electrode branch 220 in each cell 10 are in an interdigital electrode arrangement, that is to say, each source electrode branch 120 and the drain electrode branch 220 are arranged in parallel and alternate, and are connected to the semiconductor branch 410 perpendicular to the strip-shaped extension direction of the semiconductor branch 410.

Further, in the embodiment shown in FIG. 1, the number M of the source electrode branch 120 and the number N of the drain electrode branch 220 in each cell 10 is not limited, for example, the number M of the source electrode branch 120 in each cell 10 may be 1-5, and the number N of the drain electrode branch 220 may be 1-5, and of course, depending on the size of the thin film transistor and the like, the number of the source and drain branch 120 and the drain electrode branch 220 in each cell 10 may be adjusted, without limitation.

For example, in the exemplary embodiment shown in FIG. 1, the number M of the source electrode branch 120 and the number N of the drain electrode branch 220 in each cell 10 is four, and the number M of the source electrode branch 120 and the number N of the drain electrode branch 220 in each thin film transistor cell 10 can be selected according to the actual product, and in particular, can be determined according to the width to length ratio Wtotal/Ltotal of the thin film transistor to maximize the heat radiation capability.

Note that in the thin film transistor, the region on the semiconductor layer directly opposite the interval between the source electrode and the source electrode is the channel of the semiconductor layer, the channel length refers to the distance of the interval between the drain electrode and the source electrode, and the channel width refers to the dimension of the semiconductor layer in the perpendicular direction. In some embodiments of the present disclosure, in at least one embodiment of the present disclosure, channel length refers to a distance separating adjacent source electrode branch and drain electrode branch, and total channel length refers to a sum of a plurality of channel lengths.

In the embodiment shown in FIG. 1, in each of the semiconductor branch 410, the width W' of the channel corresponding to the drain electrode branch 220 and the source electrode branch 120 which are arranged adjacently is 2-20 µm, and the length L' of the channel is 2-20 µm, but this is not limited, for example, according to the width to length ratio Wtotal/Ltotal of the thin film transistor, in order to maximize the heat dissipation capacity of the thin film transistor, in a embodiment shown in FIG. 1, the width W' of the channel corresponding to the drain electrode branch 220 and the source electrode branch 120 which are adjacently arranged is 5 µm; the channel length L' is 8.5 µm.

Taking the example shown in FIG. 1, in each cell 10, at least one semiconductor branch 410 is designed as a compensation semiconductor branch 411; the channel total length of the compensation semiconductor branch 411 is less than the channel total length of the other semiconductor branch 410, and thus, according to the total channel length Ltotal of the thin film transistor, for the source electrode branch 120, when the drain electrode branch 220 and the semiconductor branch 410 are divided to form N cells 10, the cell channel length of each cell 10 is Ltotal/N, because there are Q semiconductor branch 410 in one cell 10, if Ltotal/(N*Q) is an integer, then the channel length of each semiconductor branch 410 in a cell 10 is the same, both being Ltotal/(N*Q); if Ltotal/(N*Q) is a non-integer, then in a cell 10, where (Q−1) semiconductor branch 410 have the same length, both being L1, and the remaining semiconductor branch 410 is a compensation semiconductor branch 411, the total length L2 of the channel is L2=Ltotal/N−(Q−1)*L1.

In addition, in the embodiment as shown in FIG. 1, the compensation semiconductor branch 411 may be disposed near one side of the common wiring, that is, near the center position of the thin film transistor, so that the channel length of the compensation semiconductor branch 411 is less than the channel length of the other semiconductor branch 410, which is more advantageous in heat dissipation.

Of course, in practical applications, the specific position of the compensation semiconductor branch 411 is not limited thereto, and the total length of the channel of each semiconductor branch 410 in the cell 10 is not limited, and the total length of the channel of each semiconductor branch 410 in the same cell 10 may all be the same.

Further, in the embodiment shown in FIG. 1, the orthographic projection of the gate 300 on the base substrate does not overlap the orthographic projection of the source electrode wiring 110 on the base substrate, and the orthographic projection of the gate 300 on the base substrate overlaps the orthographic projection of the drain electrode wiring 210 on the base substrate.

In the above-mentioned embodiment, the orthographic projection of the gate electrode 300 on the base substrate does not overlap with the orthographic projection of the first source electrode wiring 110a on the base substrate, for example, as illustrated in FIG. 1, the gate electrode 300 is hollowed out at the position where the first source electrode wiring 110a is arranged, so that the overlapping area of the gate electrode 300 and the first source electrode wiring 110a can be reduced, thereby reducing the CGS capacitance, namely, reducing the capacitance between the gate electrode 300 and the first source electrode wiring 110a, so as to reduce the signal DELAY; while the orthographic projection of the gate electrode 300 on the base substrate overlaps with the orthographic projection of the first drain electrode wiring 210a and the second drain electrode wiring 210b on the base substrate, for example, as shown in FIG. 1, the source electrode branch 120 and the drain electrode branch 220 and the first drain electrode wiring 210a in each cell 10 of the thin film transistor, the orthographic projection of the second drain electrode wiring 210b on the base substrate all fall on the orthographic projection of the gate electrode 300 on the base substrate, so that the CGD capacitance can be increased, i.e. Capacitance between the drain electrode 200 and the gate electrode 300 to reduce signal noise.

Furthermore, in the embodiment shown in FIG. 1, when the thin film transistor is applied, for example, in a GOA circuit, the First terminal of the first source electrode wiring 110a is connected to a clock pulse signal wiring 600 in the GOA circuit; the orthographic projection of the gate electrode 300 on the base substrate does not overlap with the orthographic projection of the clock pulse signal wiring 600 on the base substrate, and a gate electrode wiring 310 is connected to the gate electrode 300; the orthographic projection of the gate electrode wiring 310 on the base substrate overlaps the orthographic projection of the clock pulse signal wiring 600 on the base substrate.

In the above-mentioned embodiment, on the one hand, reducing the overlapping area between the gate electrode 300 and the clock pulse signal wiring 600 can further reduce the CGS capacitance, namely, reducing the capacitance between the gate electrode 300 and the clock pulse signal wiring 600 so as to reduce the signal DELAY;

On the other hand, as shown in FIG. 1, when a plurality of thin film transistor are included in a GOA circuit, taking the thin film transistor shown in FIG. 1 as an example, the thin film transistor is connected with a gate electrode 300 of other thin film transistor via a gate electrode wiring 310; the gate electrode wiring 310 is arranged on one side of the gate electrode 300 close to the clock pulse signal wiring 600, and the gate electrode 300 has a hollowed-out pattern on the side where the clock pulse signal wiring 600 is located so as not to overlap with the clock pulse signal wiring 600; only the gate electrode wiring 310 overlaps the clock pulse signal line 600 so that the hollowed-out pattern increases the distance between the gate electrode 300 of adjacent thin film transistor, thereby reducing the gate electrode 300 heating problem.

Furthermore, in the embodiment shown in FIG. 1, a drain electrode block 230 formed by using the metal layer of the drain electrode 200 is provided between two adjacent cell 10, and the drain electrode block 230 overlaps with the orthographic projection of the gate electrode 300 on the base substrate, so that the CGD capacitance, i.e. The capacitance between the metal layer of the drain electrode 200 and the gate electrode 300, can be increased to further reduce signal noise.

It is of course understood that in other embodiment, the drain electrode block 230 may not be provided between two adjacent cells 10 according to actual requirements.

In addition, in the embodiment shown in FIG. 1, one end of the drain electrode wiring 210 is connected to a signal output 500, and a first gate metal pattern 320 formed by a metal layer of a gate electrode 300 is further provided on the base substrate, wherein the first gate metal pattern 320 is located at one side of the signal output 500 and is independent from and insulated from the gate electrode 300; a plurality of first through holes 510 are provided on the signal output 500, and a plurality of second through holes 321 are provided on the first gate metal pattern 320; and the signal output 500 is connected to an ITO layer (Indium Tin Oxide (ITO)) 330 via the first through hole 510, and the first gate metal pattern 320 is connected to the ITO layer 330 via a second through hole 321, so as to realize an electrical connection between the signal output 500 and the first gate metal pattern 320, and the first gate metal pattern 320 is in turn electrically connected to a pixel electrode of a display device via the second through hole 321.

In addition, as shown in FIG. 1, one end of the first source electrode wiring 110a is connected to the clock pulse signal wiring 600, and the wiring direction of the clock pulse signal wiring 600 is perpendicular set on the first source electrode wiring 110a; the signal output 500 is connected at the same end of the first drain electrode wiring 210a and the second drain electrode wiring 210b, and is arranged perpendicular to the first drain electrode wiring 210a, and the clock pulse signal wiring 600 and the signal output 500 are respectively located at two opposite sides of the thin film transistor.

It should be noted that perpendicular in embodiment in the present disclosure not only includes an included angle of 90°, but also allows the included angle to be within a certain error range, for example, the included angle is within the range of 90°±5°, 90°±10°, etc.

It should be noted that the parallelism in embodiment in the present disclosure not only includes that the two have an included angle of 0°, but also allows the included angle thereof to be within a certain error range, for example, the included angle is within the range of 0°±5°, 0°±10°, etc.

Figure 2:
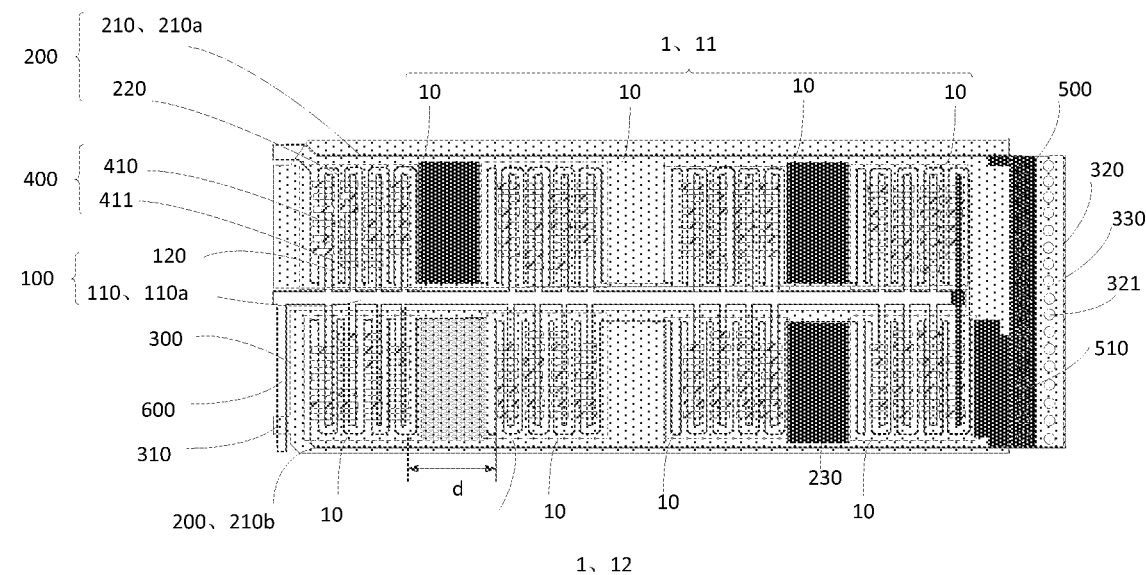
FIG. 2 shows a structural diagram of other exemplary embodiments of thin film transistor provided by the present disclosure.

FIG. 2 shows a structural diagram of thin film transistor in other specific exemplary embodiments provided by the present disclosure.

As shown in FIG. 2, the thin film transistor of other exemplary embodiment of the present disclosure differs from the thin film transistor illustrated in FIG. 1 described above in that, in the thin film transistor illustrated in FIG. 1, the orthographic projection of the semiconductor branch 410 in each cell 10 on the base substrate is a continuous strip, whereas in the thin film transistor shown in FIG. 2, the orthographic projection of the channel of each semiconductor branch 410 on the base substrate is in a discontinuous strip shape, and forms a plurality of sections of the channel which are independent from each other; each channel is connected to at least one source electrode branch 120 and at least one drain electrode branch 220, respectively.

In the above embodiment, it is further advantageous to enhance the heat dissipation capacity by designing the semiconductor branch 410 in each cell 10 in sections.

In some embodiment, as shown in FIG. 2, only one source electrode branch 220 and one source electrode 100 are respectively connected to two sides of each segment of the channel in the semiconductor branch 410, but this is not limiting; in practical applications, according to the actual requirements such as the width-to-length ratio of the channel of the thin film transistor, two or more drain electrode branch 120 or drain electrode branch 220 may also be selectively connected to each segment of the channel.

Figure 3:
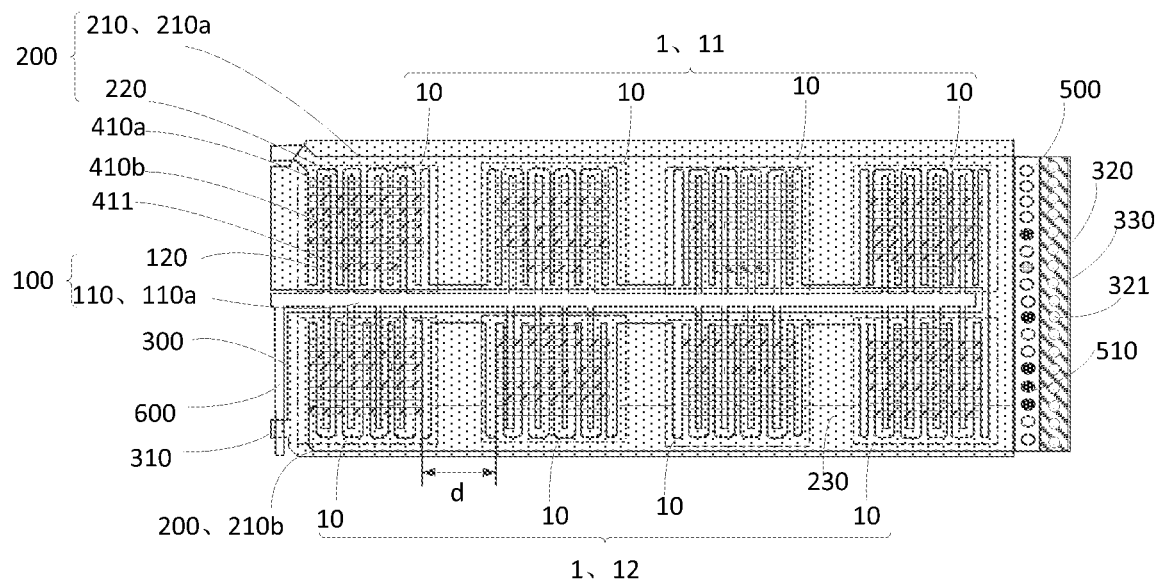
FIG. 3 shows a structural diagram of other exemplary embodiments of thin film transistor provided by the present disclosure.

FIG. 3 shows a structural diagram of thin film transistor in other specific exemplary embodiments provided by the present disclosure.

As shown in FIG. 3, the thin film transistor of other exemplary embodiment of the present disclosure differs from the thin film transistor illustrated in FIG. 1 described above in that, in the thin film transistor illustrated in FIG. 1, the orthographic projection of the semiconductor branch 410 in each cell 10 on the base substrate is a continuous strip, while in the thin film transistor shown in FIG. 3, in one cell 10, the orthographic projection of the channel of at least one of the semiconductor branch 410 on the base substrate is in a continuous strip shape, and the orthographic projection of the channel of at least one of the semiconductor branch 410 on the base substrate is in a discontinuous strip shape; and forming a plurality of independent channel, wherein the number of one of the source electrode branch 120 and the drain electrode branch 220 is greater than or equal to 2, and the number of the other is greater than or equal to 1, the source electrode branch 120 and the drain electrode branch 220 are alternately arranged in a belt-like extending direction of the semiconductor branch 410 in an interdigital electrode array. Wherein each segment of the channel is connected to at least one source electrode branch 120 and at least one drain electrode branch 220.

In the above-mentioned embodiment, a part of the semiconductor branch 410 in each cell 10 is formed into a continuous strip shape, and the other part of the semiconductor branch 410 is formed into a discontinuous strip shape, i.e. designed in sections so as to improve the heat dissipation capacity according to actual heat dissipation requirements.

To facilitate understanding, a semiconductor branch in the form of a continuous ribbon is labeled 410a and a semiconductor branch in the form of a discontinuous ribbon is labeled 410b in FIG. 3.

As shown in FIG. 3, in some embodiment, when at least three semiconductor branch 410 are included in the cell 10, the central position of each cell 10 is less likely to dissipate heat, and therefore, at least three semiconductor branch 410 are included in the cell 10. And the orthographic projection of the channel of at least one of the semiconductor branch 410 on the base substrate is in a continuous strip shape, and the orthographic projection of the channel of at least one of the semiconductor branch 410 on the base substrate is in a discontinuous strip shape, and when forming a multi-segment channel independent of each other, the semiconductor branch 410a in a continuous strip shape is located on both sides of the semiconductor branch 410b in a discontinuous strip shape, that is to say, the semiconductor branch 410b in a discontinuous strip shape with a segmented design is arranged at the central position of the cell 10 so as to facilitate heat dissipation at the central position.

Figure 4:
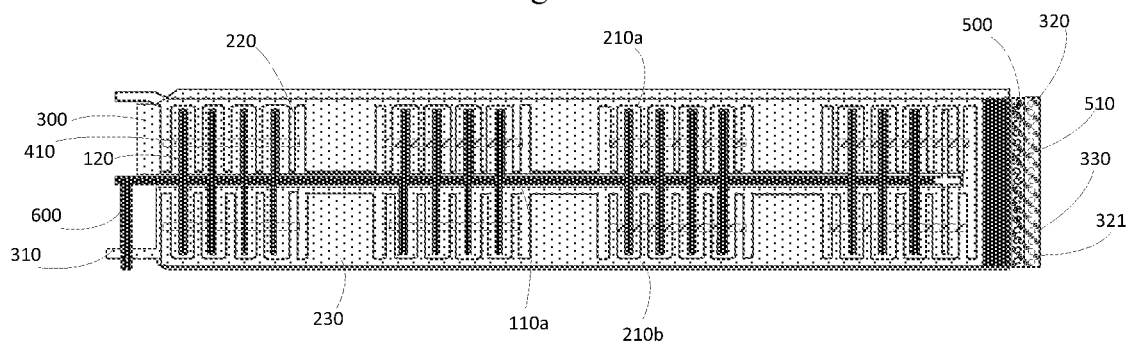
FIG. 4 shows a structural diagram of other exemplary embodiments of thin film transistor provided by the present disclosure.

FIG. 4 shows a structural diagram of thin film transistor in other specific exemplary embodiments provided by the present disclosure.

As shown in FIG. 4, the thin film transistor of other exemplary embodiments of the present disclosure differs from the above-mentioned thin film transistor illustrated in FIG. 1 in that the number Q of semiconductor branch 410 in each cell 10 in the thin film transistor illustrated in FIG. 1 is greater than or equal to 2. However, in the thin film transistor shown in FIG. 4, the number Q of semiconductor branch 410 in each cell 10 is equal to 1, that is to say, only one independent semiconductor branch 410 is included in one cell 10, and the semiconductor branch 410 in different cells 10 are independent from each other; and the orthographic projection of the semiconductor branch 410 on the base substrate is in a continuous strip shape, the number of one of the source electrode branch 120 and the drain electrode branch 220 is greater than or equal to 2, and the number of the other is greater than or equal to 1, the source electrode branch 120 and the drain electrode branch 220 are alternately arranged in a belt-like extending direction of the semiconductor branch 410 in an interdigital electrode array.

In the thin film transistor provided by the embodiment of the present disclosure, the semiconductor layer 400 in each cell 10 of the thin film transistor is independently designed, i.e. an independent semiconductor branch 410 is provided in each cell 10, and heat accumulation can be further avoided and heat dissipation can be achieved by this independent channel design structure.

Figure 5:
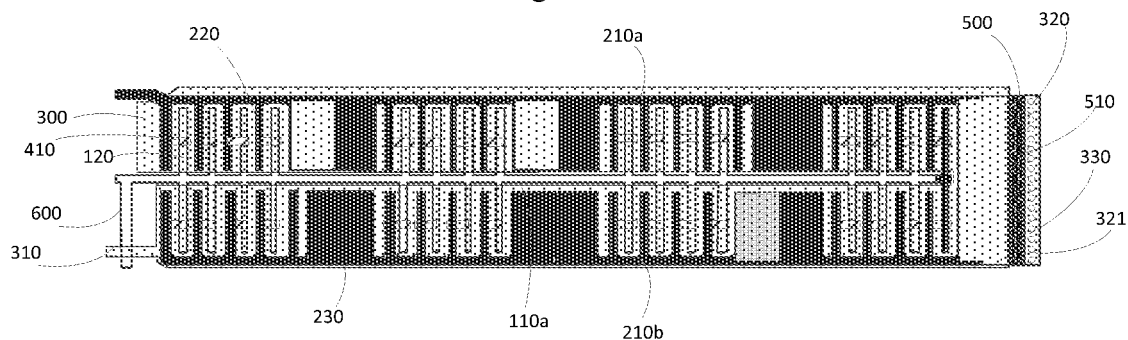
FIG. 5 shows a structural diagram of other exemplary embodiments of thin film transistor provided by the present disclosure.

FIG. 5 shows a structural diagram of thin film transistor in other specific exemplary embodiments provided by the present disclosure.

As shown in FIG. 5, the thin film transistor of other exemplary embodiments of the present disclosure differs from the thin film transistor illustrated in FIG. 4 described above in that, in the thin film transistor illustrated in FIG. 4, the orthographic projection of the semiconductor branch 410 in each cell 10 on the base substrate is a continuous strip shape, while in the thin film transistor shown in FIG. 5, the independent semiconductor branch 410 in each cell 10 is further designed in sections; the orthographic projection of the semiconductor branch 410 on the base substrate is in a discontinuous band shape, and forms a plurality of channel independent from each other, and each channel connects at least one source electrode branch 120 and at least one drain electrode branch 220, respectively.

In the thin film transistor provided by the embodiment of the present disclosure, each semiconductor branch 410 is further designed in sections while independently designing the semiconductor layer 400 in each cell 10 of the thin film transistor, and heat accumulation can be further avoided and heat dissipation can be achieved by this further independent channel design structure.

In some embodiment, as shown in FIG. 5, in each cell 10, two sides of each channel of the semiconductor branch 410 are respectively connected to one source electrode branch 120 and one drain electrode branch 220, so that the heat generation of the channel is further reduced by the independence of the channel semiconductor branch 410, so as to maximize the heat dissipation.

Furthermore, it should be noted that in each of the above-mentioned embodiment, at least two cell lines 1 are included in each of the cell lines 1, and in other embodiment provided in the present disclosure, only one cell 10 is included in each of the cell lines 1 when the arrangement space in the display device satisfies the condition, so as to further achieve maximized heat dissipation.

Figure 6:
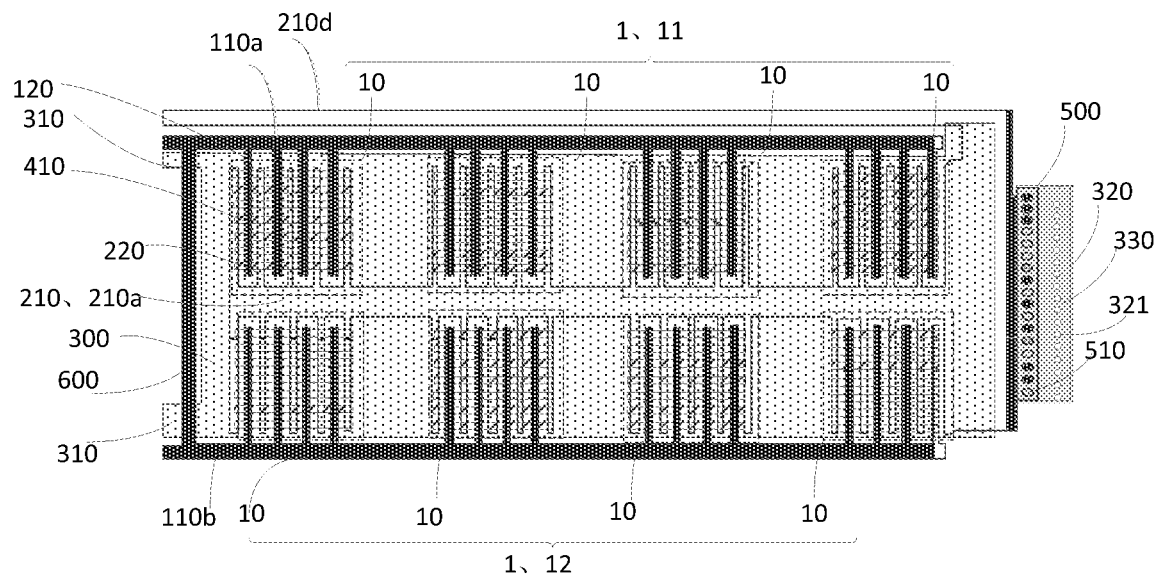
FIG. 6 shows a structural diagram of other exemplary embodiments of thin film transistor provided by the present disclosure.

In addition, FIG. 6 shows a structural diagram of thin film transistor in some other specific exemplary embodiments provided by the present disclosure.

As shown in FIG. 6, the thin film transistor of other exemplary embodiment of the present disclosure differs from the above-described thin film transistor illustrated in FIG. 1 in that, in the thin film transistor illustrated in FIG. 1, the source electrode branch 120 of two adjacent cell line 1 share the same source electrode wiring 110, while in the thin film transistor illustrated in FIG. 6, the source electrode wiring 110 and the electrode wiring 210 are alternately arranged, and the drain electrode branch 220 of each cell 10 in two adjacent cell line 1 share the same drain electrode wiring 210.

Specifically, as shown in FIG. 6, in some exemplary embodiment, the thin film transistor includes a source electrode 100, a drain electrode 200, a gate electrode 300, and a semiconductor layer 400. The source electrode 100 comprises a plurality of source electrode branch 120, a first source electrode wiring 110a and a second source electrode wiring 110b, the drain electrode 200 comprises a plurality of drain electrode branch 220 and a first drain electrode wiring 210a, the semiconductor layer 400 comprises a plurality of semiconductor branch 410, and the source electrode branch 120; the drain electrode branch 220 and the semiconductor branch 410 are divided into a plurality of cell 10 (TFT units), wherein each cell 10 comprises M source electrode branch 120, N drain electrode branch 220 and Q semiconductor branch 410, M; N and Q are both integers greater than or equal to 1; the first source electrode wiring 110a, the first drain electrode wiring 210a and the second source electrode wiring 110b are arranged in parallel and spaced apart; and the first drain electrode wiring 210a is located between a first source electrode wiring 110a and a second source electrode wiring 110b, and a plurality of cells 10 are arranged at intervals between the first drain electrode wiring 210a and the first source electrode wiring 110a to form a first cell line 11; a plurality of cells 10 are arranged at intervals between the first drain electrode wiring 210a and the second source electrode wiring 110b to form a second cell line 12; wherein the source electrode branch 120 of each cell 10 in the first cell line 11 is connected to the first source electrode wiring 110a, and the source electrode branch 120 of each cell 10 in the second cell line 12 is connected to the second source electrode wiring 110b; the drain electrode branch 220 of each cell 10 in the first cell line 11 is connected to one side of the first drain electrode wiring 210a, and the drain electrode branch 220 of each cell 10 in the second cell line 12 is connected to the other side of the first drain electrode wiring 210a, that is, the source electrode branch 120 in the first cell line 11 and the drain electrode branch 220 in the second cell line 12 share the same drain electrode wiring 210a.

In addition, it should be noted that in some embodiment shown in FIG. 6, in order to increase the heat dissipation capacity of the thin film transistor, the line width of the drain electrode branch 220 may also be increased, and the line width of the drain electrode branch 220 may be about 3-15 μm. In particular, with regard to the above-mentioned embodiment in which the drain electrode branch 220 in two adjacent cell lines 1 share the same first drain electrode wiring 210a, since the drain electrode branch 220 is located in the central region of the thin film transistor, by adding the drain electrode 200 line width in the central region of the thin film transistor, the heat dissipation capacity of the thin film transistor itself can be improved more; furthermore, in other embodiment of the present disclosure, since the first drain electrode wiring 210a is shared and located at the center of the thin film transistor, it is possible to enhance the heat dissipation capacity of the thin film transistor by increasing the line width of the first drain electrode wiring 210a, for example, the line width of the first drain electrode wiring 210a is 5-20 μm, and further, the line width of the first drain electrode wiring 210a is 3-15 μm.

In addition, in the present disclosure, such as the embodiment shown in FIG. 6, it is the same as the embodiment shown in FIG. 1 that the orthographic projection of the gate electrode 300 on the base substrate and the first source electrode wiring 110a, the orthographic projection of the second source electrode wiring 110b on the base substrate does not overlap, and the orthographic projection of the gate electrode 300 on the base substrate overlaps with the orthographic projection of the first drain electrode wiring 210a on the base substrate, however, the difference from the thin film transistor illustrated in FIG. 1 above may also be that The structure design of the gate electrode 300 is different.

Specifically, in some exemplary embodiment shown in FIG. 6, unlike the embodiment shown in FIG. 1, since the first drain electrode wiring 210a is located in the middle of the first source electrode wiring 110a and the second source electrode wiring 110b, the central region of the gate electrode 300 faces the first drain electrode wiring 210a, and therefore the hollow design shown in FIG. 1 is no longer performed on the central region of the gate electrode 300; so that the orthographic projection of the first drain electrode wiring 210a on the base substrate falls on the orthographic projection of the gate electrode 300 on the base substrate, so that the CGD capacitance can be increased, i.e. The capacitance between the metal layer of the drain electrode 200 and the gate electrode 300 to reduce signal noise; in addition, the width L1 of the gate electrode 300 in the direction of the perpendicular from the first source electrode wiring 110a is designed such that Less than the distance H of the first source electrode wiring 110a and the second source electrode wiring 110b in the direction of the perpendicular from the first source electrode wiring 110a, so as to ensure that the first source electrode wiring 110a; the second source electrode wiring 110b does not overlap the orthographic projection of the gate electrode 300 on the base substrate, and thus the overlapping area of the gate electrode 300 and the source electrode wiring 110 can be reduced so as to reduce CGS capacitance, namely, decrease capacitance between gate electrode 300 and source electrode wiring 110 to decrease signal DELAY. It should be noted that in practice, the structure of the gate electrode 300 may be the same as the structure of the gate electrode 300 illustrated in FIG. 1.

In addition, the embodiment shown in FIG. 6 may further differ from the embodiment shown in FIG. 1 in that:

In the embodiment shown in FIG. 6, the gate electrode wiring 310 connected on the gate electrode 300 can be designed as two gate electrode wiring 310, one of the gate electrode wiring 310 is arranged on one side of the gate electrode 300 close to the first source electrode wiring 110a, and the other gate electrode wiring 310 is arranged on one side of the gate electrode 300 close to the second source electrode wiring 110*b*, and when a plurality of thin film transistor are included in a GOA circuit, the thin film transistor and the gate electrode 300 of the other thin film transistor can be connected via the two gate electrode wiring 310;

The clock pulse signal wiring 600 is arranged in a direction perpendicular to the first source electrode wiring 110*a*, and is connected between the first source electrode wiring 110*a* and the second source electrode wiring 110*b*; and is located on the side of the gate electrode 300 where the gate electrode wiring 310 is set, and the gate electrode 300 on the side where the gate electrode wiring 310 is set does not overlap with the orthographic projection of the clock pulse signal wiring 600 on the base substrate, the clock pulse signal wiring 600 overlaps the orthographic projection of two of the gate electrode wiring 310 on the base substrate such that the distance between the gates 300 of adjacent thin film transistor may be increased, thereby reducing the gate electrode 300 heating problem.

It should be noted that FIG. 6 is merely an exemplary embodiment, and in other embodiment of the present disclosure, the design of the embodiment 300 is not limited thereto when the drain electrode branch 220 in two adjacent cell lines 1 share the same drain electrode wiring 210 according to practical requirements.

In addition, as shown in FIG. 6, one end of the first source electrode wiring 110*a* and the second source electrode wiring 110*b* is connected to the same clock pulse signal wiring 600, and one end of the first drain electrode wiring 210*a* is connected to a signal output 500; the clock pulse signal wiring 600 and the signal output 500 are respectively located at two opposite sides of the thin film transistor, and at one side where the signal output 500 is located, a first gate metal pattern 320 formed by a metal layer of a gate electrode 300 is further provided on a base substrate; the first gate metal pattern 320 is located at one side of the signal output 500 and is independent from and insulated from the gate electrode 300; a plurality of first through holes 510 are provided on the signal output 500; a plurality of second through holes 321 are provided on the first gate metal pattern 320; the signal output 500 is connected to an ITO layer 330 via the first through holes 510; the first gate metal pattern 320 is connected to the ITO layer 330 via the second through holes 321, so as to realize the electrical connection between the signal output 500 and the first gate metal pattern 320; and the first gate metal pattern 320 is in turn electrically connected to a pixel electrode of a display device via the second through holes 321.

Further, in the embodiment shown in FIG. 6, the difference from the embodiment shown in FIG. 1 is that:

In the embodiment shown in FIG. 6, a drain electrode block 230 formed using a metal layer of the drain electrode 200 is not provided between adjacent cells 10, because FIG. 6 is only an exemplary embodiment, and the drain electrode block 230 may not be provided when a CGD capacitance between the drain electrode 200 and the gate electrode 300 is not required in a practical requirement. However, it should be understood that the above is only an example, and in practical applications, when the CGD capacitance to the thin film transistor in the embodiment shown in FIG. 6 is increased, a drain electrode block 230 formed using the metal layer of the drain electrode 200 may be provided between adjacent cells 10.

Note that, in the thin film transistor in the embodiment shown in FIG. 6, the specific structure, the number and arrangement of the source electrode branch 220, the drain electrode branch 120, and the semiconductor branch 410 may be the same as the thin film transistor shown in FIG. 1, and will not be described again.

It will be understood, of course, that in the thin film transistor in the embodiment shown in FIG. 6, the specific structure, the number and arrangement of the source electrode branch 220, the drain electrode branch 120 and the semiconductor branch 410 may be different from those of the thin film transistor shown in FIG. 1.

In addition, as shown in FIG. 6, a signal line 210*d* can also be led out on the signal output 500, wherein the signal line 210*d* is formed using a drain electrode metal and is arranged in parallel with the first drain electrode wiring 110*a*, and the signal line 210*d* is used for realizing the drain electrode electrical connection between various thin film transistor in a GOA circuit.

Figure 7:
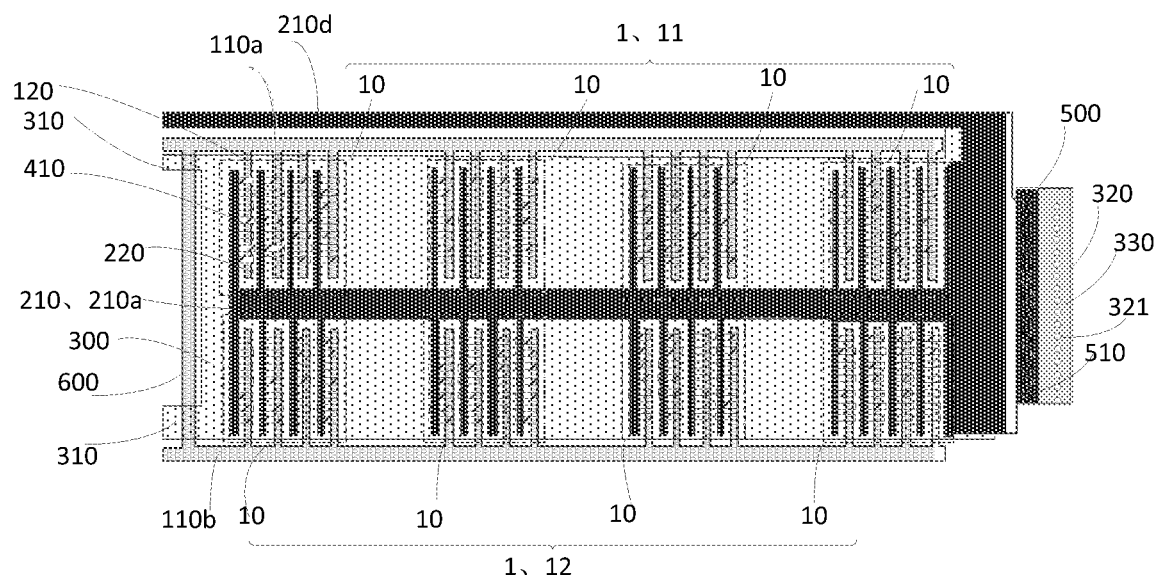
FIG. 7 shows a structural diagram of other exemplary embodiments of thin film transistor provided by the present disclosure.

FIG. 7 shows a structural diagram of thin film transistor in other specific exemplary embodiments provided by the present disclosure.

As shown in FIG. 7, the thin film transistor of other exemplary embodiment of the present disclosure differs from the thin film transistor illustrated in FIG. 6 described above in that: in the thin film transistor shown in FIG. 6, the orthographic projection of the semiconductor branch 410 in each cell 10 on the base substrate is a continuous strip; in the thin film transistor shown in FIG. 7, the orthographic projection of the channel of each of the semiconductor branch 410 on the base substrate is in the form of a discontinuous band and forms a plurality of channel independent from each other, and each channel connects at least one source electrode branch 120 and at least one drain electrode branch 220, respectively.

In the above embodiment, it is further advantageous to enhance the heat dissipation capacity by designing the semiconductor branch 410 in each cell 10 in sections.

In some exemplary embodiment, as shown in FIG. 7, only one source electrode branch 220 and one source electrode branch 100 are respectively connected to two sides of each segment of the channel in the semiconductor branch 410, but this is not limiting. In practical applications, according to the actual requirements such as the width-to-length ratio of the channel of the thin film transistor, two or more drain electrode branch 120 or drain electrode branch 220 may also be selectively connected to each segment of the channel.

Figure 8:
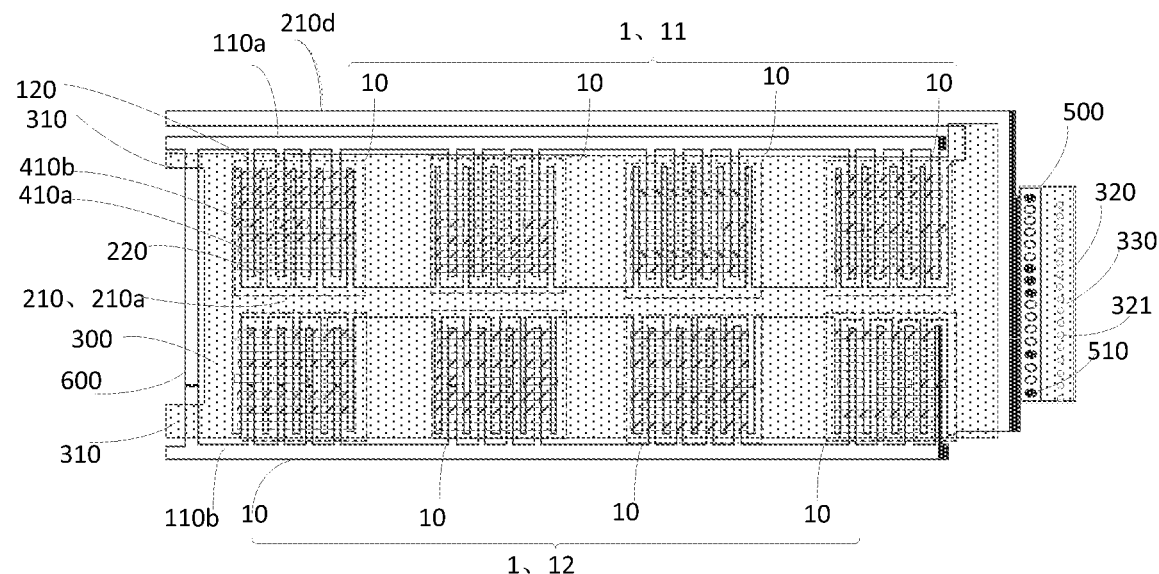
FIG. 8 shows a structural diagram of other exemplary embodiments of thin film transistor provided by the present disclosure.

FIG. 8 shows a structural diagram of thin film transistor in other specific exemplary embodiments provided by the present disclosure.

As shown in FIG. 8, the thin film transistor of other exemplary embodiment of the present disclosure differs from the thin film transistor illustrated in FIG. 6 described above in that, in the thin film transistor illustrated in FIG. 6, the orthographic projection of the semiconductor branch 410 on the base substrate in each cell 10 is a continuous strip, while in the thin film transistor shown in FIG. 8, in one cell 10, the orthographic projection of the channel of at least one of the semiconductor branch 410 on the base substrate is in a continuous strip shape, and the orthographic projection of the channel of at least one of the semiconductor branch 410 on the base substrate is in a discontinuous strip shape; and forming to form a plurality of channel independent from each other, wherein the number of one of the source electrode branch 120 and the drain electrode branch 220 is greater than or equal to 2, and the number of the other is greater than or equal to 1, the source electrode branch 120 and the drain electrode branch 220 are alternately arranged in a belt-like extending direction of the semiconductor branch 410 in an interdigital electrode array. Wherein each segment of the channel is connected to at least one source electrode branch 120 and at least one drain electrode branch 220.

In the above-mentioned embodiment, a part of the semiconductor branch 410 in each cell 10 is formed into a continuous strip shape, and the other part of the semiconductor branch 410 is formed into a discontinuous strip shape, i.e. designed in sections so as to improve the heat dissipation capacity according to actual heat dissipation requirements.

Wherein, as shown in FIG. 8, in some embodiment, when at least three semiconductor branch 410 are included in the cell 10, the central position of each cell 10 is less likely to dissipate heat, and therefore the at least three semiconductor branch 410 are included in the cell 10; and the orthographic projection of the channel of at least one of the semiconductor branch 410 on the base substrate is in a continuous strip shape, and the orthographic projection of the channel of at least one of the semiconductor branch 410 on the base substrate is in a discontinuous strip shape, and when forming a multi-segment channel independent of each other, the semiconductor branch 410 in a continuous strip shape is located on both sides of the semiconductor branch 410 in a discontinuous strip shape, that is, the semiconductor branch 410 in a segmented design is arranged at the central position of the cell 10 so as to facilitate heat dissipation at the central position.

Figure 9:
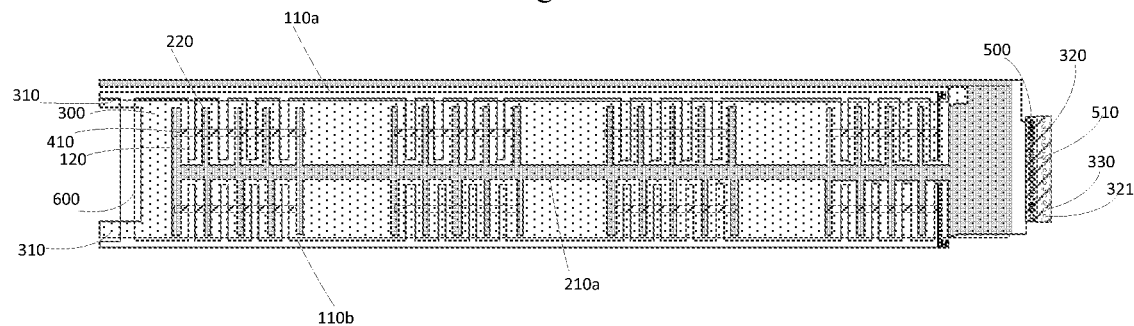
FIG. 9 shows a structural diagram of other exemplary embodiments of thin film transistor provided by the present disclosure.

FIG. 9 shows a structural diagram of thin film transistor in other specific exemplary embodiments provided by the present disclosure.

As shown in FIG. 9, the thin film transistor of other exemplary embodiments of the present disclosure differs from the above-mentioned thin film transistor illustrated in FIG. 6 in that the number Q of semiconductor branch 410 in each cell 10 in the thin film transistor illustrated in FIG. 6 is greater than or equal to 2. However, in the thin film transistor shown in FIG. 9, the number Q of semiconductor branch 410 in each cell 10 is equal to 1, that is to say, only one independent semiconductor branch 410 is included in one cell 10, and the semiconductor branch 410 in different cells 10 are independent from each other; and the orthographic projection of the semiconductor branch 410 on the base substrate is in a continuous strip shape, the number of one of the source electrode branch 120 and the drain electrode branch 220 is greater than or equal to 2, and the number of the other is greater than or equal to 1, the source electrode branch 120 and the drain electrode branch 220 are alternately arranged in a belt-like extending direction of the semiconductor branch 410 in an interdigital electrode array.

In the thin film transistor provided by the embodiment of the present disclosure, the semiconductor layer 400 in each cell 10 of the thin film transistor is independently designed, i.e. an independent semiconductor branch 410 is provided in each cell 10, and heat accumulation can be further avoided and heat dissipation can be achieved by this independent channel design structure.

Figure 10:
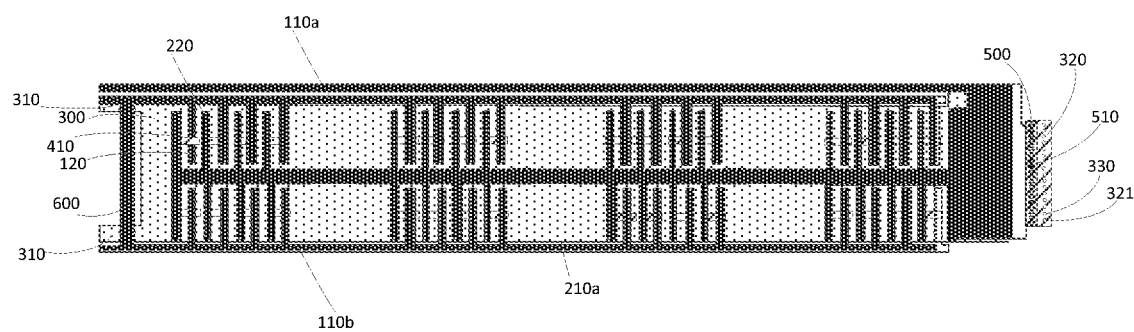
FIG. 10 shows a structural diagram of other exemplary embodiments of thin film transistor provided by the present disclosure.

FIG. 10 shows a structural diagram of thin film transistor in other specific exemplary embodiments provided by the present disclosure.

As shown in FIG. 10, the thin film transistor of other exemplary embodiments of the present disclosure differs from the thin film transistor illustrated in FIG. 6 described above in that, in the thin film transistor illustrated in FIG. 6, the orthographic projection of the semiconductor branch 410 in each cell 10 on the base substrate is a continuous strip shape, while in the thin film transistor shown in FIG. 10, the independent semiconductor branch 410 in each cell 10 is further designed in sections; the orthographic projection of the semiconductor branch 410 on the base substrate is in a discontinuous band shape, and forms a plurality of channel independent from each other, and each channel connects at least one source electrode branch 120 and at least one drain electrode branch 220, respectively.

In the thin film transistor provided by the embodiment of the present disclosure, each semiconductor branch 410 is further designed in sections while independently designing the semiconductor layer 400 in each cell 10 of the thin film transistor, and heat accumulation can be further avoided and heat dissipation can be achieved by this further independent channel design structure.

In some embodiment, as shown in FIG. 10, in each cell 10, two sides of each channel of the semiconductor branch 410 are respectively connected to one source electrode branch 120 and one drain electrode branch 220, so that the heat generation of the channel is further reduced by the independence of the channel semiconductor branch 410, so as to maximize the heat dissipation.

Furthermore, it should be noted that in each of the above-mentioned embodiment, at least two cell lines 1 are included in each of the cell lines 1, and in other embodiment provided in the present disclosure, only one cell 10 is included in each of the cell lines 1 when the arrangement space in the display device satisfies the condition, so as to achieve maximized heat dissipation.

Figure 11:
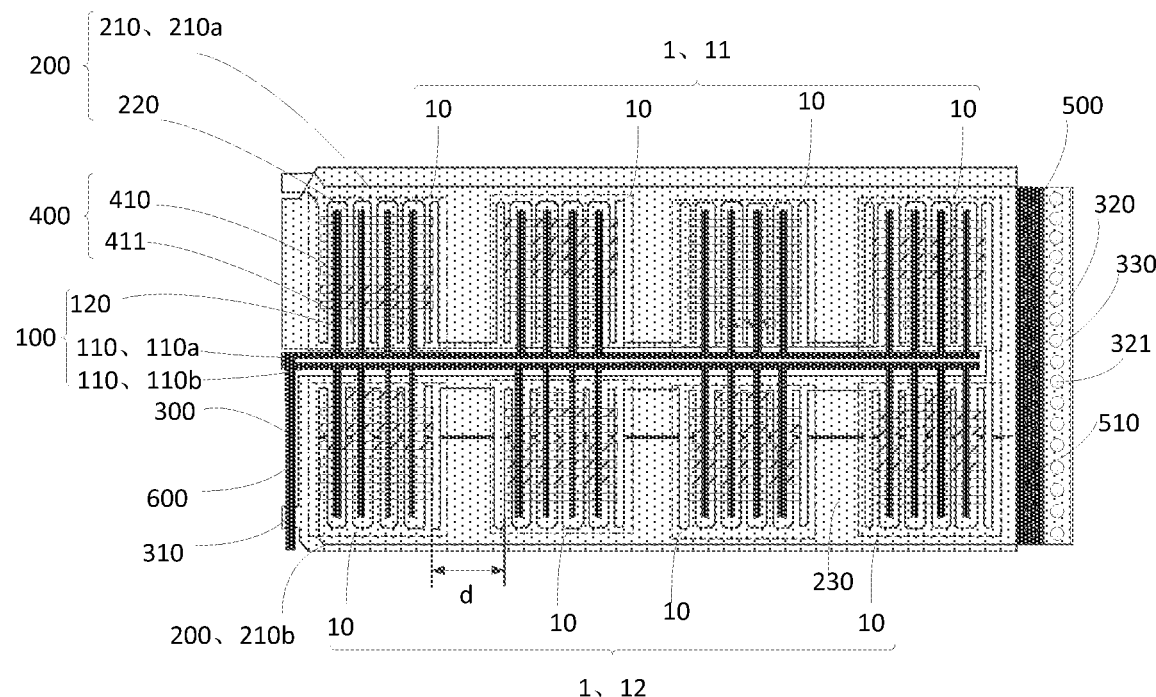
FIG. 11 shows a structural diagram of other exemplary embodiments of thin film transistor provided by the present disclosure.

In addition, FIG. 11 shows a structural diagram of thin film transistor in some other specific exemplary embodiments provided by the present disclosure.

As shown in FIG. 11, the thin film transistor of other exemplary embodiment of the present disclosure differs from the thin film transistor illustrated in FIG. 1 described above in that, in the thin film transistor illustrated in FIG. 1, the source electrode branch 120 of two adjacent cell lines 1 share the same source electrode wiring 110, while in the thin film transistor shown in FIG. 11, the source electrode wiring 110 is added, that is to say, the number of the source electrode wiring 110 is greater than or equal to 2; the number of the drain electrode wiring 210 is greater than or equal to 2, and one of the source electrode wiring 110 and one of the drain electrode wiring 210 are arranged adjacent to each other and form a group of wiring; one cell line 1 is set between the source electrode wiring 110 and the drain electrode wiring 210 within the same group of wiring, and the source electrode wiring 110 and the drain electrode wiring 210 do not share between different groups of wiring.

Specifically, taking the example shown in FIG. 11, in some exemplary embodiment, the thin film transistor includes source electrode 100, drain electrode 200, gate electrode 300, and semiconductor layer 400. The source electrode 100 comprises a plurality of source electrode branch 120, a first source electrode wiring 110a and a second source electrode wiring 110b, and the source electrode 200 comprises a plurality of drain electrode branch 220; a first drain electrode wiring 210a and a second drain electrode wiring 210b, wherein the semiconductor layer 400 comprises a plurality of semiconductor branch 410, and the source electrode branch 120, the drain electrode branch 220 and the semiconductor branch 410 are divided into a plurality of cell 10 (TFT units), wherein each cell 10 comprises M source electrode branch 120, N drain electrode branch 220 and Q semiconductor branch 410, M; N and Q are both integers greater than or equal to 1; the first drain electrode wiring 210a, the first source electrode wiring 110a, the second source electrode wiring 110b and the second drain electrode wiring 210b are successively arranged in parallel and at intervals, multiple cells 10 are arranged at intervals between the first drain electrode wiring 210a and the first source electrode wiring 110a to form a first cell line 11, and multiple cells 10 are arranged at intervals between the second drain electrode wiring 210b and the second source electrode wiring 110b to form a second cell line 12; wherein the source electrode branch 120 of each cell 10 in the first cell line 11 is connected to the first source electrode wiring 110a, and the source electrode branch 120 of each cell 10 in the second cell line 12 is connected to the second source electrode wiring 110b; the drain electrode branch 220 of each cell 10 in the first cell line 11 is connected to one side of the first drain electrode wiring 210a, and the drain electrode branch 220 of each cell 10 in the second cell line 12 is connected to the second drain electrode wiring 210b, that is, the source electrode branch 120 in the first cell line 11 and the drain electrode branch 220 in the second cell line 12 are connected to different drain electrode wiring 210 independently. In this way, when the drain electrode wiring 210 of two adjacent cell lines 1 are independently connected to the same signal output 500, the current accumulation on each drain electrode wiring 210 can be reduced, and the current accumulation inside each cell 10 will not be all accumulated on the same wiring, further reducing the calorific value.

It should be noted that the exemplary embodiment shown in FIG. 11 differs from the exemplary embodiment shown in FIG. 1 only in that In FIG. 1, there is only one source electrode wiring 110 and the source electrode branch 120 of the first cell line 11 and the second cell line 12 share the source electrode wiring 110 (namely, the first source electrode wiring 110a), while in the exemplary embodiment shown in FIG. 11, there are two source electrode wiring 110, and a first source electrode wiring 110a and a second source electrode wiring 110b are arranged in parallel and adjacent to each other, and both are located in the middle of the two drain electrode wiring 210; and when the thin film transistor is applied to a GOA circuit, one end of two source electrode wiring 110 is connected to the same clock pulse signal wiring 600, and the clock pulse signal wiring 600 is set with the source electrode wiring 110 perpendicular; one end of two drain electrode wiring 210 is connected to the same signal output 500, and the signal output 500 is set to be perpendicular to the drain electrode wiring 210; the clock pulse signal wiring 600 and the signal output 500 are located on opposite sides of a thin film transistor, respectively.

Note that, in the thin film transistor in the embodiment shown in FIG. 11, the specific structure of the drain electrode branch 220, the source electrode branch 120 and the semiconductor branch 410, the number and arrangement of the branch, the structure of the gate 300 and the gate wiring 310, etc. may be the same as the thin film transistor shown in FIG. 1, FIG. 2, FIG. 3, FIG. 4 or FIG. 5, and will not be described again.

For example, in the present disclosure, only the specific structure, branch number and arrangement of the drain electrode branch 220, the source electrode branch 120 and the semiconductor branch 410, and the structure of the gate 300, the gate wiring 310, etc. shown in the embodiment shown in FIG. 11 that are the same as the thin film transistor shown in FIG. 1 are taken as an example, and with regard to the specific structure, the branch number and arrangement of the drain electrode branch 220, the source electrode branch 120 and the semiconductor branch 410, and the branch 300, the structure of the gate wiring 310, etc. shown in the embodiment shown in FIG. 11 that are the same as the thin film transistor shown in the embodiments of FIG. 2, FIG. 3, FIG. 4 and FIG. 5 are not illustrated.

It is understood, of course, that in the thin film transistor in the embodiment shown in FIG. 11, the specific structure of the drain electrode branch 220, the source electrode branch 120 and the semiconductor branch 410, the number and arrangement of the branch, and the structure of the gate 300 and the gate wiring 310, etc. may be different from the thin film transistor shown in FIG. 1, FIG. 2, FIG. 3, FIG. 4 or FIG. 5, and will not be repeated here.

Figure 12:
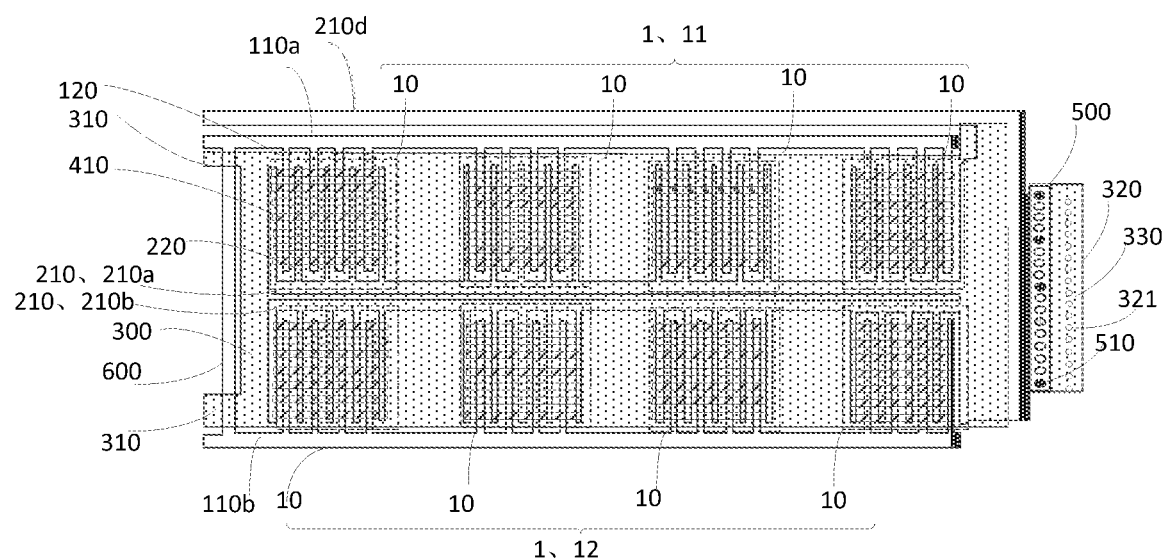
FIG. 12 shows a structural diagram of other exemplary embodiments of thin film transistor provided by the present disclosure.

In addition, FIG. 12 shows a structural diagram of thin film transistor in some other specific exemplary embodiments provided by the present disclosure.

As shown in FIG. 12, the thin film transistor of other exemplary embodiment of the present disclosure differs from the thin film transistor illustrated in FIG. 6 described above in that, in the thin film transistor illustrated in FIG. 6, the two adjacent source electrode branch 120 of the cell line 1 share the same drain electrode wiring 210 (namely, the first drain electrode wiring 210a), while in the thin film transistor shown in FIG. 12, one drain electrode wiring 210 is added, that is to say, the number of the source electrode wiring 110 is greater than or equal to 2, the number of the drain electrode wiring 210 is greater than or equal to 2, and one of the source electrode wiring 110 and one of the drain electrode wiring 210 are arranged adjacent to each other and form a group of wiring; one cell line 1 is set between the source electrode wiring 110 and the drain electrode wiring 210 within the same group of wiring, and the source electrode wiring 110 and the drain electrode wiring 210 do not share between different groups of wiring.

Specifically, taking FIG. 12 as an example, in some exemplary embodiment, the thin film transistor includes source electrode 100, drain electrode 200, gate electrode 300, and semiconductor layer 400. The source electrode 100 comprises a plurality of source electrode branch 120, a first source electrode wiring 110a and a second source electrode wiring 110b, and the source electrode 200 comprises a plurality of drain electrode branch 220; a first drain electrode wiring 210a and a second drain electrode wiring 210b, wherein the semiconductor layer 400 comprises a plurality of semiconductor branch 410, and the source electrode branch 120, the drain electrode branch 220 and the semiconductor branch 410 are divided into a plurality of cell 10 (TFT units), wherein each cell 10 comprises M source electrode branch 120, N drain electrode branch 220 and Q semiconductor branch 410, M; N and Q are both integers greater than or equal to 1; the first source electrode wiring 110a, the first source electrode wiring 210a, the second source electrode wiring 210b and the second source electrode wiring 110b are successively arranged in parallel and at intervals, multiple cells 10 are arranged at intervals between the first source electrode wiring 210a and the first drain electrode wiring 110a to form a first cell line 11, and multiple cells 10 are arranged at intervals between the second drain electrode wiring 210b and the second drain electrode wiring 110b to form a second cell line 12; wherein the source electrode branch 120 of each cell 10 in the first cell line 11 is connected to the first source electrode wiring 110a, and the source electrode branch 120 of each cell 10 in the second cell line 12 is connected to the second source electrode wiring 110b; the drain electrode branch 220 of each cell 10 in the first cell line 11 is connected to one side of the first drain electrode wiring 210a, and the drain electrode branch 220 of each cell 10 in the second cell line 12 is connected to the second drain electrode wiring 210b, that is, the source electrode branch 120 in the first cell line 11 and the drain electrode branch 220 in the second cell line 12 are connected to different drain electrode wiring 210 independently. In this way, when the drain electrode wiring 210 of two adjacent cell lines 1 are independently connected to the same signal output 500, the current accumulation on each drain electrode wiring 210 can be reduced, and the current accumulation inside each cell 10 will not be all accumulated on the same wiring, further reducing the calorific value.

Note that, the exemplary embodiment shown in FIG. 12 differs from that of FIG. 6 in that, as shown in FIG. 6, only one drain electrode wiring 210 is provided, and the drain electrode branch 220 of the first cell line 11 and the second cell line 12 share the drain electrode wiring 210. While in the exemplary embodiment shown in FIG. 12, there are two drain electrode wiring 210, and the two drain electrode wiring 210 are arranged in parallel, adjacent to each other and are located in the middle of the two source electrode wiring 110, when the thin film transistor is applied in a GOA circuit, one end of two source electrode wiring 110 is connected to the same clock pulse signal wiring 600, and the clock pulse signal wiring 600 is arranged perpendicular to the source electrode wiring 110; one end of two drain electrode wiring 210 is connected to the same signal output 500, and the signal output 500 is set perpendicular to the drain electrode wiring 210; the clock pulse signal wiring 600 and the signal output 500 are located on opposite sides of a thin film transistor, respectively.

Note that, in the thin film transistor in the embodiment shown in FIG. 12, the specific structure of the drain electrode branch 220, the source electrode branch 120 and the semiconductor branch 410, the number and arrangement of the branch, the structure of the gate 300 and the gate wiring 310, etc. may be the same as the thin film transistor shown in FIG. 1, FIG. 2, FIG. 3, FIG. 4 or FIG. 5, and will not be described again.

For example, in the present disclosure, only the specific structure, branch number and arrangement of the drain electrode branch 220, the source electrode branch 120 and the semiconductor branch 410, and the structure of the gate 300, the gate wiring 310, etc. shown in the embodiment shown in FIG. 12 that are the same as the thin film transistor shown in FIG. 1 are taken as an example, and with regard to the specific structure, the branch number and arrangement of the drain electrode branch 220, the source electrode branch 120 and the semiconductor branch 410, and the branch 300, the structure of the gate wiring 310, etc. shown in the embodiment shown in FIG. 12 that are the same as the thin film transistor shown in the embodiments of FIG. 2, FIG. 3, FIG. 4 and FIG. 5 are not illustrated.

It is understood, of course, that in the thin film transistor in the embodiment shown in FIG. 12, the specific structure of the drain electrode branch 220, the source electrode branch 120 and the semiconductor branch 410, the number and arrangement of the branch, and the structure of the gate 300 and the gate wiring 310, etc. may be different from the thin film transistor shown in FIG. 1, FIG. 2, FIG. 3, FIG. 4 or FIG. 5, and will not be repeated here.

In addition, in any one of the embodiment shown in FIGS. 1 to 12, at least one source electrode wiring or at least one drain electrode wiring may be added to arrange a plurality of cells into at least three cell lines, and at least three cell lines share at least one source electrode wiring and one drain electrode wiring, which will not be enumerated in the following description only taking the embodiment shown in FIGS. 13, 14 and 15 as an example.

Figure 13:
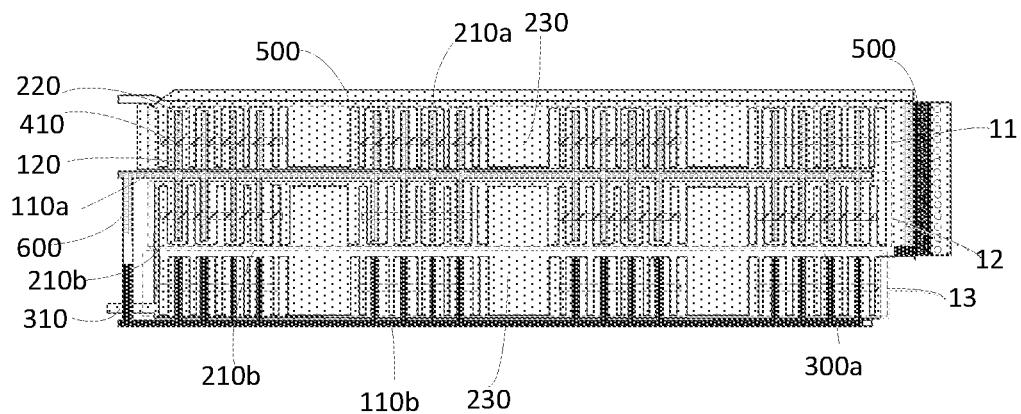
FIG. 13 shows a structural diagram of other exemplary embodiments of thin film transistor provided by the present disclosure.

FIG. 13 shows structural diagram of thin film transistor in other exemplary embodiments provided by the present disclosure.

The thin film transistor of other exemplary embodiment as shown in FIG. 13 differs from the thin film transistor illustrated in FIG. 1 in that, the source electrode wiring 110 is added, i.e. a second source electrode wiring 110b is added. And the second source electrode wiring 110b is located at one side of the second drain electrode wiring 210b away from the first source electrode wiring 110a, and a plurality of cells 10 are distributed at intervals with a region between the second drain electrode wiring 210b, so as to form a third cell line 13; and the source electrode branch 120 of the second cell line 12 and the third cell line 13 share the second drain electrode wiring 210b.

Specifically, as shown in FIG. 13, in some exemplary embodiment, the thin film transistor includes a source electrode 100, a drain electrode 200, a gate electrode 300, and a semiconductor layer 400. The source electrode 100 comprises a plurality of source electrode branch 120, a first source electrode wiring 110a and a second source electrode wiring 110b, and the source electrode 200 comprises a plurality of drain electrode branch 220; a first drain electrode wiring 210a and a second drain electrode wiring 210b, wherein the semiconductor layer 400 comprises a plurality of semiconductor branch 410, and the source electrode branch 120, the drain electrode branch 220 and the semiconductor branch 410 are divided into a plurality of cell 10 (TFT units), and each cell 10 comprises M source electrode branch 120; N drain electrode branch 220 and Q semiconductor branch 410 semiconductor branch 130, wherein M, N and Q are integers greater than or equal to 1; the first drain electrode wiring 210a, the first source electrode wiring 110a, a second drain electrode wiring 210b and a second source electrode wiring 110b are arranged in parallel and at intervals; and the first drain electrode wiring 210a is located between a first source electrode wiring 110a and a second source electrode wiring 110b, and a plurality of cells 10 are arranged at intervals between the first drain electrode wiring 210a and the first source electrode wiring 110a to form a first cell line 11; a plurality of cells 10 are arranged at intervals between the first source electrode wiring 110a and the second drain electrode wiring 210b to form a second cell line 12; a plurality of cells 10 are arranged at intervals between a second source electrode wiring 110b and a second drain electrode wiring 210b to form a third cell line 13; the source electrode branch 120 of the first cell line 11 and the second cell line 12 are both connected to the first source electrode wiring 110a to share the first source electrode wiring 110a, and the drain electrode branch 220 of the second cell line 12 and the third cell line 13 are both connected to the second drain electrode wiring 210b to share the second drain electrode wiring 210b.

Note that, in the thin film transistor in the embodiment shown in FIG. 12, the specific structure of the drain electrode branch 220, the source electrode branch 120 and the semiconductor branch 410, the number and arrangement of the branch, the structure of the gate 300 and the gate wiring 310, etc. may be the same as the thin film transistor shown in FIG. 1, FIG. 2, FIG. 3, FIG. 4 or FIG. 5, and will not be described again.

For example, in the present disclosure, only the specific structure, branch number and arrangement of the drain electrode branch 220, the source electrode branch 120 and the semiconductor branch 410, and the structure of the gate 300, the gate wiring 310, etc. shown in the embodiment shown in FIG. 12 that are the same as the thin film transistor shown in FIG. 4 are taken as an example, and with regard to the specific structure, the branch number and arrangement of the drain electrode branch 220, the source electrode branch 120 and the semiconductor branch 410, and the branch 300, the structure of the gate wiring 310, etc. shown in the embodiment shown in FIG. 12 that are the same as the thin film transistor shown in the embodiments of FIG. 1, FIG. 2, FIG. 3 and FIG. 5 are not illustrated.

It is understood, of course, that in the thin film transistor in the embodiment shown in FIG. 12, the specific structure of the drain electrode branch 220, the source electrode branch 120 and the semiconductor branch 410, the number and arrangement of the branch, and the structure of the gate 300 and the gate wiring 310, etc. may be different from the thin film transistor shown in FIG. 1, FIG. 2, FIG. 3, FIG. 4 or FIG. 5, and will not be repeated here.

Figure 14:
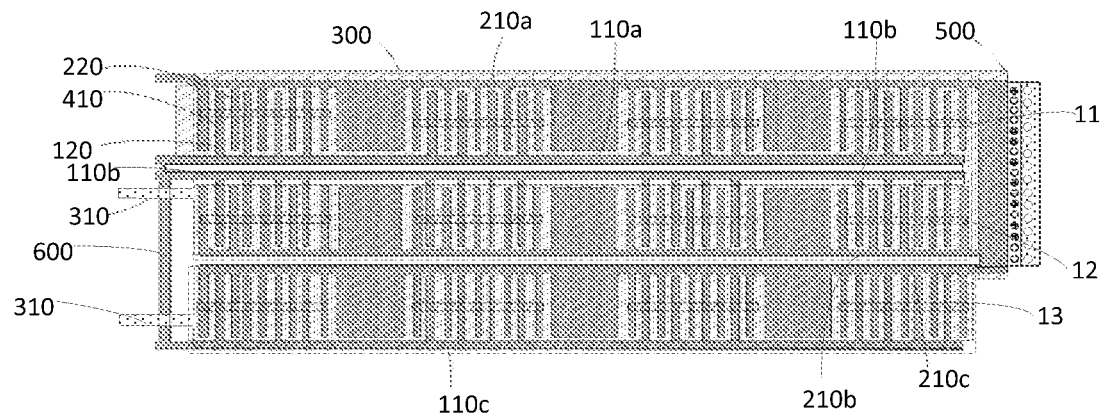
FIG. 14 shows a structural diagram of other exemplary embodiments of thin film transistor provided by the present disclosure.

In addition, FIG. 14 shows structural diagram of thin film transistor in other exemplary embodiments provided by the present disclosure.

The thin film transistor of the exemplary embodiment as shown in FIG. 14 differs from the above-mentioned thin film transistor illustrated in FIG. 11 in that, a group of wiring is added, that is, a third drain electrode wiring 210c and a third source electrode wiring 110c are added, and a region between the third drain electrode wiring 210c and the third source electrode wiring 110c is spaced apart by a plurality of cells 10 to form a third cell line 13.

Specifically, taking the example shown in FIG. 14, in some exemplary embodiment, the thin film transistor includes source electrode 100, drain electrode 200, gate electrode 300, and semiconductor layer 400. The source electrode 100 comprises a plurality of source electrode branch 120, a first source electrode wiring 110a, a second source electrode wiring 110b and a third source electrode wiring 110c, the drain electrode 200 comprises a plurality of drain electrode branch 220, a first drain electrode wiring 210a, a second drain electrode wiring 210b and a third drain electrode wiring 210c, the semiconductor layer 400 comprises a plurality of semiconductor branch 410; the source electrode branch 120, the drain electrode branch 220 and the semiconductor branch 410 are divided into a plurality of cell 10 (TFT units); each cell 10 comprises M source electrode branch 120, N drain electrode branch 220 and Q semiconductor branch 410 semiconductor branch 130, wherein M, N and Q are integers greater than or equal to 1; the first drain electrode wiring 210a, the first source electrode wiring 110a, the second source electrode wiring 110b, the second drain electrode wiring 210b, the third drain electrode wiring 210c and the third source electrode wiring 110c are successively arranged in parallel and at intervals;

The first drain electrode wiring 210a, the first source electrode wiring 110a being a group of cells, and a plurality of cells 10 being arranged at intervals between the first drain electrode wiring 210a and the first source electrode wiring 110a to form a first cell line 11;

The second drain electrode wiring 210b, the second source electrode wiring 110b being a group of cells, and a plurality of cells 10 being arranged at intervals between the second drain electrode wiring 210b and the second source electrode wiring 110b so as to form a second cell line 12;

The third drain electrode wiring 210c, the third source electrode wiring 110c being a group of cells, and a plurality of cells 10 being arranged at intervals between the second drain electrode wiring 210b and the second source electrode wiring 110b so as to form a third cell line 13;

Wherein the source electrode branch 120 of each cell 10 in the first cell line 11 is connected to the first source electrode wiring 110a, and the drain electrode branch 220 of each cell 10 in the first cell line 11 is connected to the first drain electrode wiring 210a;

The source electrode branch 120 of each cell 10 in the second cell line 12 is connected to the second source electrode wiring 110b, and each drain electrode branch 220 of each cell 10 in the second cell line 12 is connected to the second drain electrode wiring 210b;

The source electrode branch 120 of each cell 10 in the third cell line 13 is connected to the third source electrode wiring 110c, and the drain electrode branch 220 of each cell 10 in the third cell line 13 is connected to the third drain electrode wiring 210c.

That is, the source electrode branch 120 and the drain electrode branch 220 in the different cell lines 1 are connected to the separate and different drain electrode wiring 210, respectively, so that the drain electrode wiring 210 of the adjacent two cell lines 1 are separately connected to the same signal output 500, respectively, thereby reducing the current accumulation in each drain electrode wiring 210, and the current accumulation in each cell 10 does not accumulate in the same wiring, thereby further reducing the calorific value.

Note that, in the exemplary embodiment shown in FIG. 14, the only difference from the exemplary embodiment shown in FIG. 11 is that a third source electrode wiring 110c and a third drain electrode wiring 210c are added, wherein the first source electrode wiring 110a; the second source electrode wiring 110b and the third source electrode wiring 110c can be connected to the clock pulse signal wiring 600, the first drain electrode wiring 210a, the second drain electrode wiring 210b and the third drain electrode wiring 210c are connected to the same signal output 500, and the clock pulse signal wiring 600 and the signal output 500 are respectively located opposite sides of a thin film transistor, respectively.

Note that, in the thin film transistor in the embodiment shown in FIG. 14, the specific structure of the drain electrode branch 220, the source electrode branch 120 and the semiconductor branch 410, the number and arrangement of the branch, the structure of the gate 300 and the gate wiring 310, etc. may be the same as the thin film transistor shown in FIG. 1 to FIG. 13, and will not be described again.

For example, in the present disclosure, only the specific structure, branch number and arrangement of the drain electrode branch 220, the source electrode branch 120 and the semiconductor branch 410, and the structure of the gate 300, the gate wiring 310, etc. shown in the embodiment shown in FIG. 14 that are the same as the thin film transistor shown in FIG. 11 are taken as an example, and with regard to the specific structure, the branch number and arrangement of the drain electrode branch 220, the source electrode branch 120 and the semiconductor branch 410, and the branch 300, the structure of the gate wiring 310, etc. shown in the embodiment shown in FIG. 16 that are the same as the thin film transistor shown in the embodiments of FIGS. 1-10, FIG. 12-FIG. 13 are not illustrated.

It is understood, of course, that in the thin film transistor in the embodiment shown in FIG. 14, the specific structure of the drain electrode branch 220, the source electrode branch 120 and the semiconductor branch 410, the number and arrangement of the branch, and the structure of the gate 300 and the gate wiring 310, etc. may be different from the thin film transistor shown in FIG. 1 to FIG. 13, and will not be repeated here.

Figure 15:
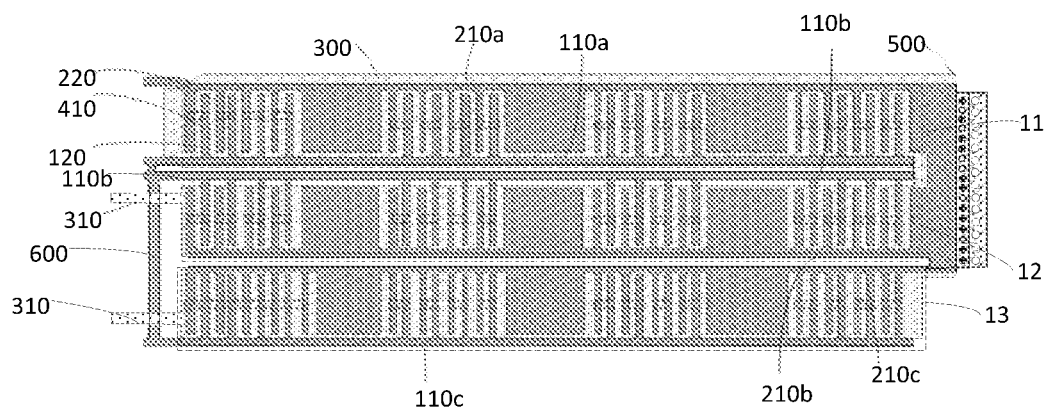
FIG. 15 shows a structural diagram of other exemplary embodiments of thin film transistor provided by the present disclosure.

In addition, FIG. 15 shows structural diagram of thin film transistor in other exemplary embodiments provided by the present disclosure.

As shown in FIG. 15, the thin film transistor of other exemplary embodiments of the present disclosure differs from the thin film transistor illustrated in FIG. 14 described above in that, in the thin film transistor illustrated in FIG. 14, the orthographic projection of the semiconductor branch 410 on the base substrate is a continuous strip shape, while in the thin film transistor shown in FIG. 15, the independent semiconductor branch 410 in each cell 10 is further designed in sections; the orthographic projection of the semiconductor branch 410 on the base substrate is in a discontinuous band shape, and forms a plurality of channel independent from each other, and each channel connects at least one source electrode branch 120 and at least one drain electrode branch 220, respectively.

In the thin film transistor provided by the embodiment of the present disclosure, each semiconductor branch 410 is further designed in sections while independently designing the semiconductor layer 400 in each cell 10 of the thin film transistor, and heat accumulation can be further avoided and heat dissipation can be achieved by this further independent channel design structure.

In some embodiment, as shown in FIG. 15, in each cell 10, two sides of each channel of the semiconductor branch 410 are respectively connected to one source electrode branch 120 and one drain electrode branch 220, so that the heat generation of the channel is further reduced by the independence of the channel semiconductor branch 410, so as to maximize the heat dissipation.

Furthermore, it should be noted that in each of the above-mentioned embodiment, at least two cell lines 1 are included in each of the cell lines 1, and in other embodiment provided in the present disclosure, only one cell 10 may be included in each of the cell lines 1 when the arrangement space in the display device satisfies the condition, so as to achieve maximized heat dissipation.

It should be noted that in the above-mentioned disclosed embodiment, only two cell lines and three cell lines can be formed in a thin film transistor, and in practical applications, a number of more than three cell lines can also be formed by adding a source electrode wiring 110 or a drain electrode wiring 210, so long as the inventive concept is similar to the present disclosure, they all fall within the scope of the present disclosure, and will not be described again.

In addition, the present disclosure embodiment also provides a gate electrode row driving circuit comprising: a plurality of thin film transistor, the thin film transistor employing the thin film transistor provided by embodiment of the present disclosure; a signal output 500, wherein each drain electrode wiring 210 in the thin film transistor is connected to the same the signal output 500; and a clock pulse signal line 600, wherein each of the source electrode wiring 110 in the thin film transistor is connected to the same clock pulse signal line 600.

In addition, the embodiment of the present disclosure also provides an array substrate comprising a base substrate and a gate electrode row driving circuit provided by the embodiment of the present disclosure formed on the base substrate.

The embodiment of the present disclosure also provides a display device, including the array substrate provided by the embodiment of the present disclosure. The display device includes, but is not limited to: radio frequency cell, network module, audio output cell, input cell, sense device, display cell, user input unit, interface unit, memory, processor and power. It will be appreciated by those skilled in the art that the structure of the display device described above is not intended to be limiting of the display device, and that the display device may include more or less of the components described above, or some combinations of the components, or different arrangements of the components. In the embodiment of the present invention, the display device includes, but is not limited to, a monitor, a cell phone, a tablet computer, a television, a wearable electronic equipment, a navigation dispaly device, etc.

The display device may be: any product or component with display function, such as television, display, digital photo frame, mobile phone, tablet computer, wherein the display device further comprises flexible circuit board, printed circuit board and backplate.

The following points need to be explained:
(1) The embodiment drawings of the present disclosure relate only to structures related to the embodiment of the present disclosure, and other structures may refer to general designs.
(2) In the drawings used to describe the embodiment of the present disclosure, the thickness of layers or regions are exaggerated or reduced for clarity, i.e. the drawings are not drawn to scale. It will be understood that when an element such as a layer, film, region or base plate is referred to as being "on" or "under" another element, it can be "directly on" or "directly under" the other element or intervening elements may be present.
(3) Without conflict, the embodiment and features in the embodiment of the present disclosure can be combined with each other to obtain a new embodiment.

The foregoing is only a specific embodiment of the present disclosure, but the scope of the present disclosure is not limited thereto, and the scope of the present disclosure should be determined by reference to the appended claims.

What is claimed is:

1. A thin film transistor, comprising:
a source electrode, comprising a source electrode wiring and a plurality of source electrode branches;
a drain electrode, comprising a drain electrode wiring and a plurality of drain electrode branches;
a gate insulated from the source electrode and the drain electrode;
and a semiconductor layer in contact with and connected to the plurality of source electrode branches and the plurality of drain electrode branches, comprising a plurality of semiconductor branches;
wherein the plurality of source electrode branches, and the plurality of drain electrode branches are in contact with the plurality of semiconductor branch, and are divided into a plurality of cells, wherein each cell comprises M source electrode branches, N drain electrode branches and Q semiconductor branches, and M, N and Q are integers greater than or equal to 1;
the source electrode wiring and the drain electrode wiring are arranged in parallel and spaced apart, a number of the source electrode wiring is m, a number of the drain electrode wiring is n, one of m and n is an integer greater than or equal to 2, another of m and n is an integer greater than or equal to 1;
a plurality of the cells are arranged in a region between the source electrode wiring and an adjacent the drain electrode wiring, so as to arrange the plurality of the cells into at least two cell lines, wherein the source electrode branch of each cell in each cell line is electrically connected to the same one of the source electrode wiring, and the drain electrode branch of each cell in each cell line is electrically connected to the same one of the drain electrode wiring.

2. The thin film transistor according to claim 1, wherein, the source electrode wiring and the drain electrode wiring are arranged alternately, and drain electrode branches of each cell in two adjacent cell lines share the same drain electrode wiring.

3. The thin film transistor according to claim 1, wherein, a line width of an individual drain electrode branch and/or an individual drain electrode wiring is 3-15 mum.

4. The thin film transistor according to claim 1, wherein, the source electrode wiring and the drain electrode wiring are arranged alternately, and source electrode branches of each cell in two adjacent cell lines share the same source electrode wiring.

5. The thin film transistor according to claim 1, wherein, the number of the source electrode wiring is greater than or equal to 2, the number of the drain electrode wiring is greater than or equal to 2, and one source electrode wiring and one drain electrode wiring are arranged adjacent to each other and form a group of wiring;
one cell line is set between the source electrode wiring and the drain electrode wiring within the same group of wiring, and the source electrode wiring and the drain electrode wiring do not share between different groups of wiring.

6. The thin film transistor according to claim 1, wherein, each of the cell lines comprises at least two of the cells, and a predetermined distance is maintained between the cells in each of the cell lines.

7. The thin film transistor according to claim 6, wherein, a number of the cells in the thin film transistor is greater than or equal to 3, and/or the predetermined distance is d, 20 µm≤d≤500 µm.

8. The thin film transistor according to claim 1, wherein, each cell line comprises only one cell.

9. The thin film transistor according to claim 1, wherein, in each of the cells, a number of semiconductor branches is greater than or equal to 2, and the semiconductor branches are arranged in parallel and spaced apart; and an orthographic projection of a channel of each of the semiconductor branches on a base substrate is in a continuous strip shape, a number of source electrode branches is k, a number of drain electrode branches is 1, one of k and 1 is an integer greater than or equal to 2, another of k and 1 is an integer greater than or equal to 1, and the source electrode branches and the drain electrode branches are alternately arranged along a strip-shaped extension direction of the semiconductor branches in an interdigital electrode array.

10. The thin film transistor according to claim 1, wherein, in each of the cells, a number of semiconductor branches is greater than or equal to 2, and each of the semiconductor branches is arranged in parallel and spaced apart, and an orthographic projection of a channel of each of the semiconductor branches on a base substrate is in a discontinuous strip shape, and forms a plurality of sections of channel which are independent from each other, and each section of channel is respectively connected to at least one source electrode branch and at least one drain electrode branch.

11. The thin film transistor according to claim 1, wherein, in each of the cells, a number of semiconductor branches is greater than or equal to 2, and each of the semiconductor branches is arranged in parallel and spaced apart, and an orthographic projection of a channel of at least one of the semiconductor branches on a base substrate is in a continuous strip shape,
an orthographic projection of at least one channel of the semiconductor branches on the base substrate is in a discontinuous strip shape, and is formed so as to form a plurality of segments of channel which are independent from each other;
a number of source electrode branches is k, a number of drain electrode branches is 1, one of k and 1 is an integer greater than or equal to 2, another of k and 1 is an integer greater than or equal to 1; the source electrode branches and the drain electrode branches are alternately arranged in a belt-shaped extension direction of the semiconductor branches in an interdigital electrode array, wherein each segment of the channel is connected to at least one of the source electrode branches and at least one of the drain electrode branches.

12. The thin film transistor according to claim 1, wherein, an individual cell comprises at least three semiconductor branches, and an orthographic projection of a first channel of a first semiconductor branch of the at least three semiconductor branches on a base substrate is in a continuous strip shape, and an orthographic projection of a second channel of a second semiconductor branch of the at least three semiconductor branches on the base substrate is in a discontinuous strip shape and is formed so as to form a plurality of sections of channel which are independent from each other,
the first semiconductor branch is located on both sides of the second semiconductor branch.

13. The thin film transistor according to claim 12, wherein,
at least one of the semiconductor branches in an individual cell is a compensation semiconductor branch, and a total length of the channel of the compensation semiconductor branch is less than the total length of the channel of other semiconductor branch.

14. The thin film transistor according to claim 1, wherein, within each cell, a number of semiconductor branches is equal to 1, and
an orthographic projection of the semiconductor branches on a base substrate is in a continuous strip shape, a number of source electrode branches is k, a number of drain electrode branches is 1, one of k and 1 is an integer greater than or equal to 2, another of k and 1 is an integer greater than or equal to 1; and the source electrode branches and the drain electrode branches are alternately arranged along a strip-shaped extension direction of the semiconductor branch in an interdigital electrode array.

15. The thin film transistor according to claim 1, wherein, in each cell, a number of semiconductor branches is equal to 1, and an orthographic projection of the semiconductor branches on a base substrate is in a discontinuous strip shape, and forms a plurality of segments of channel which are independent from each other, with each segment of channel respectively connecting at least one source electrode branch and at least one drain electrode branch.

16. The thin film transistor according to claim 1, wherein, in each individual semiconductor branch, a width W of a channel corresponding to a drain electrode branch and a source electrode branch arranged adjacently is 2-20 µm, and a length L of the channel is 2-20 µm.

17. The thin film transistor according to claim 1, wherein, an orthographic projection of the gate on a base substrate does not overlap an orthographic projection of the source electrode wiring on the base substrate, and the orthographic projection of the gate on the base substrate overlaps an orthographic projection of the drain electrode wiring on the base substrate.

18. The thin film transistor according to claim 1, wherein, a first terminal of the source electrode wiring is connected to a clock pulse signal wiring,
an orthographic projection of the gate on a base substrate does not overlap with an orthographic projection of the clock pulse signal wiring on the base substrate, a gate wiring is connected to the gate, and an orthographic projection of the gate wiring on the base substrate is arranged crosswise to the orthographic projection of the clock pulse signal wiring on the base substrate.

19. The thin film transistor according to claim 1, wherein, a drain electrode block is formed by using a metal layer of the drain electrode is provided between two adjacent cell, and the drain electrode block overlaps with an orthographic projection of the gate on a base substrate.

20. A Gate on Array circuit, comprising:
a plurality of thin film transistors as claimed in claim 1;
a signal output, wherein each drain electrode wiring in the thin film transistor is connected to the same the signal output;
and a clock pulse signal line, each source electrode wiring in the thin film transistor being connected to the same clock pulse signal line.

\* \* \* \* \*